(12) United States Patent
Kuwabara et al.

(10) Patent No.: US 9,224,792 B2
(45) Date of Patent: Dec. 29, 2015

(54) SEMICONDUCTOR DEVICE AND MANUFACTURING METHOD THEREOF

(71) Applicant: Semiconductor Energy Laboratory Co., Ltd., Kanagawa-ken (JP)

(72) Inventors: Hideaki Kuwabara, Kanagawa (JP); Hideto Ohnuma, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/496,168

(22) Filed: Sep. 25, 2014

(65) Prior Publication Data

US 2015/0069367 A1   Mar. 12, 2015

Related U.S. Application Data

(63) Continuation of application No. 13/892,438, filed on May 13, 2013, now Pat. No. 8,847,483, which is a continuation of application No. 11/545,910, filed on Oct. 11, 2006, now Pat. No. 8,441,185.

(30) Foreign Application Priority Data

Oct. 17, 2005   (JP) ................. 2005-302315

(51) Int. Cl.
*H01L 33/06*   (2010.01)
*H01L 27/32*   (2006.01)
(Continued)

(52) U.S. Cl.
CPC ........ *H01L 27/3262* (2013.01); *H01L 27/3246* (2013.01); *H01L 27/3258* (2013.01); *H01L 33/36* (2013.01); *H01L 51/0011* (2013.01); *H01L 2251/5338* (2013.01)

(58) Field of Classification Search
CPC .. H01L 27/3246; H01L 33/36; H01L 51/0011
USPC .......................... 313/498, 501, 504, 512, 506
See application file for complete search history.

(56) References Cited

U.S. PATENT DOCUMENTS 5,119,156 A   6/1992  Kawahara et al.
6,067,134 A   5/2000  Akiyama et al.
(Continued)

FOREIGN PATENT DOCUMENTS

CN   001383352 A   12/2002
CN   001452438 A   10/2003
(Continued)

OTHER PUBLICATIONS

Taiwanese Office Action re Application No. TW 95136941, dated Nov. 15, 2012.
(Continued)

*Primary Examiner* — Tracie Y Green
(74) *Attorney, Agent, or Firm* — Husch Blackwell LLP

(57) ABSTRACT

As a result of miniaturization of a pixel region associated with an improvement in definition and an increase in a substrate size associated with an increase in area, defects due to precision, bending, and the like of a mask used at the time of evaporation have become issues. A partition including portions with different thicknesses over a pixel electrode (also referred to as a first electrode) in a display region and in the vicinity of a pixel electrode layer is formed, without increasing the number of steps, by using a photomask or a reticle provided with an auxiliary pattern having a light intensity reduction function made of a diffraction grating pattern or a semi-transmissive film.

34 Claims, 16 Drawing Sheets

(51) Int. Cl.
*H01L 33/36* (2010.01)
*H01L 51/00* (2006.01)

(56) References Cited

U.S. PATENT DOCUMENTS

| | | | |
|---|---|---|---|
| 6,369,495 B2 | 4/2002 | Codama et al. |
| 6,373,453 B1 | 4/2002 | Yudasaka |
| 6,392,722 B1 | 5/2002 | Sekime et al. |
| 6,420,834 B2 | 7/2002 | Yamazaki et al. |
| 6,465,268 B2 | 10/2002 | Hirakata et al. |
| 6,469,439 B2 | 10/2002 | Himeshima et al. |
| 6,555,968 B2 | 4/2003 | Yamazaki et al. |
| 6,559,594 B2 | 5/2003 | Fukunaga et al. |
| 6,597,121 B2 | 7/2003 | Imura |
| 6,614,174 B1 | 9/2003 | Urabe et al. |
| 6,618,029 B1 | 9/2003 | Ozawa |
| 6,638,781 B1 | 10/2003 | Hirakata et al. |
| 6,720,198 B2 | 4/2004 | Yamagata et al. |
| 6,739,931 B2 | 5/2004 | Yamazaki et al. |
| 6,743,650 B2 | 6/2004 | Hirakata et al. |
| 6,750,618 B2 | 6/2004 | Yamazaki et al. |
| 6,768,257 B1 | 7/2004 | Yamada et al. |
| 6,781,162 B2 | 8/2004 | Yamazaki et al. |
| 6,787,407 B2 | 9/2004 | Nakamura et al. |
| 6,798,132 B2 | 9/2004 | Satake |
| 6,815,723 B2 | 11/2004 | Yamazaki et al. |
| 6,828,726 B2 | 12/2004 | Sakurai et al. |
| 6,852,997 B2 | 2/2005 | Yamazaki et al. |
| 6,888,304 B2 | 5/2005 | Sato |
| 6,927,833 B2 | 8/2005 | Kim et al. |
| 6,952,020 B1 | 10/2005 | Yamazaki et al. |
| 6,958,490 B2 | 10/2005 | Okamoto et al. |
| 6,960,786 B2 | 11/2005 | Yamazaki et al. |
| 6,969,291 B2 | 11/2005 | Urabe et al. |
| 6,977,463 B2 | 12/2005 | Sato |
| 6,991,506 B2 | 1/2006 | Yamada et al. |
| 6,992,332 B2 | 1/2006 | Yamazaki et al. |
| 6,992,439 B2 | 1/2006 | Yamazaki et al. |
| 6,995,511 B2 | 2/2006 | Yamazaki et al. |
| 7,012,367 B2 | 3/2006 | Seki |
| 7,015,503 B2 | 3/2006 | Seki et al. |
| 7,034,453 B2 | 4/2006 | Kai et al. |
| 7,038,651 B2 | 5/2006 | Nitta et al. |
| 7,057,209 B2 | 6/2006 | Yamazaki et al. |
| 7,098,602 B2 | 8/2006 | Yamazaki et al. |
| 7,112,115 B1 | 9/2006 | Yamazaki et al. |
| 7,214,959 B2 | 5/2007 | Seki et al. |
| 7,221,338 B2 | 5/2007 | Yamazaki et al. |
| 7,265,391 B2 | 9/2007 | Yamazaki et al. |
| 7,273,801 B2 | 9/2007 | Seki et al. |
| 7,282,736 B2 | 10/2007 | Murakami et al. |
| 7,307,381 B2 | 12/2007 | Ito et al. |
| 7,309,269 B2 | 12/2007 | Yamazaki et al. |
| 7,332,854 B2 | 2/2008 | Kai et al. |
| 7,352,350 B2 | 4/2008 | Nitta et al. |
| 7,384,860 B2 | 6/2008 | Nakamura et al. |
| 7,402,948 B2 | 7/2008 | Yamazaki et al. |
| 7,405,515 B2 | 7/2008 | Satake |
| 7,420,210 B2 | 9/2008 | Yamazaki et al. |
| 7,423,293 B2 | 9/2008 | Yamagata et al. |
| 7,442,955 B2 | 10/2008 | Seki et al. |
| 7,483,001 B2 | 1/2009 | Matsueda |
| 7,491,562 B2 | 2/2009 | Murakami et al. |
| 7,501,756 B2 | 3/2009 | Kim et al. |
| 7,554,116 B2 | 6/2009 | Yamazaki et al. |
| 7,554,128 B2 | 6/2009 | Okamoto et al. |
| 7,585,761 B2 | 9/2009 | Yamazaki et al. |
| 7,623,098 B2 | 11/2009 | Yamazaki et al. |
| 7,623,099 B2 | 11/2009 | Yamazaki et al. |
| 7,623,100 B2 | 11/2009 | Yamazaki et al. |
| 7,642,701 B2 | 1/2010 | Kai et al. |
| 7,662,011 B2 | 2/2010 | Yamazaki et al. |
| 7,671,369 B2 | 3/2010 | Yamazaki et al. |
| 7,683,535 B2 | 3/2010 | Fukunaga et al. |
| 7,692,186 B2 | 4/2010 | Yamazaki et al. |
| 7,697,106 B2 | 4/2010 | Sawasaki et al. |
| 7,719,014 B2 | 5/2010 | Yamazaki et al. |
| 7,723,179 B2 | 5/2010 | Yamazaki et al. |
| 7,745,993 B2 | 6/2010 | Fukunaga et al. |
| 7,753,751 B2 | 7/2010 | Yamazaki |
| 7,792,489 B2 | 9/2010 | Hirakata et al. |
| 7,898,173 B2 | 3/2011 | Ito et al. |
| 7,932,518 B2 | 4/2011 | Seki et al. |
| 7,977,876 B2 | 7/2011 | Yamazaki et al. |
| 7,982,206 B2 | 7/2011 | Yamazaki et al. |
| 7,982,692 B2 | 7/2011 | Matsueda |
| 7,989,808 B2 | 8/2011 | Yamazaki et al. |
| 7,990,348 B2 | 8/2011 | Yamazaki et al. |
| 8,008,666 B2 | 8/2011 | Yamazaki et al. |
| 8,089,066 B2 | 1/2012 | Yamazaki et al. |
| 8,119,468 B2 | 2/2012 | Miyairi et al. |
| 8,129,902 B2 | 3/2012 | Kai et al. |
| 8,138,032 B2 | 3/2012 | Miyairi et al. |
| 8,194,008 B2 | 6/2012 | Yamazaki et al. |
| 8,232,934 B2 | 7/2012 | Sato |
| 8,237,355 B2 | 8/2012 | Yamazaki |
| 8,267,735 B2 | 9/2012 | Ito et al. |
| 8,294,637 B2 | 10/2012 | Matsueda |
| 8,415,669 B2 | 4/2013 | Yamazaki et al. |
| 8,415,881 B2 | 4/2013 | Satake |
| 8,525,760 B2 | 9/2013 | Matsueda |
| 8,853,940 B2 | 10/2014 | Satake |
| 2001/0004469 A1 | 6/2001 | Himeshima et al. |
| 2002/0047514 A1 | 4/2002 | Sakurai et al. |
| 2002/0093286 A1 | 7/2002 | Ohshita et al. |
| 2002/0158570 A1 | 10/2002 | Yamada et al. |
| 2002/0180371 A1 | 12/2002 | Yamazaki et al. |
| 2003/0122140 A1 | 7/2003 | Yamazaki et al. |
| 2003/0146439 A1 | 8/2003 | Yamazaki et al. |
| 2003/0146695 A1 | 8/2003 | Seki |
| 2003/0189400 A1 | 10/2003 | Nishio et al. |
| 2003/0194484 A1 | 10/2003 | Yamazaki et al. |
| 2003/0201716 A1 | 10/2003 | Yamazaki et al. |
| 2003/0230764 A1 | 12/2003 | Yamazaki et al. |
| 2004/0061118 A1 | 4/2004 | Yamazaki et al. |
| 2004/0084673 A1 | 5/2004 | Hirakata et al. |
| 2004/0086639 A1 | 5/2004 | Grantham et al. |
| 2004/0089900 A1 | 5/2004 | Ishikawa et al. |
| 2004/0135501 A1 | 7/2004 | Nishikawa |
| 2004/0207789 A1 | 10/2004 | Hirakata et al. |
| 2004/0218112 A1 | 11/2004 | Hirakata et al. |
| 2005/0057151 A1 | 3/2005 | Kuwabara |
| 2005/0140291 A1 | 6/2005 | Hirakata et al. |
| 2005/0162080 A1 | 7/2005 | Yaegashi |
| 2005/0200273 A1 | 9/2005 | Nozawa |
| 2005/0218396 A1 | 10/2005 | Tsuchiya et al. |
| 2006/0081844 A1 | 4/2006 | Hirosue et al. |
| 2006/0132029 A1 | 6/2006 | Sato |
| 2006/0199461 A1 | 9/2006 | Yamazaki et al. |
| 2006/0202615 A1 | 9/2006 | Murakami et al. |
| 2007/0015430 A1 | 1/2007 | Nishio et al. |
| 2007/0045621 A1 | 3/2007 | Suzuki et al. |
| 2007/0114921 A1 | 5/2007 | Yamazaki et al. |
| 2008/0018229 A1 | 1/2008 | Yamazaki |
| 2008/0252207 A1 | 10/2008 | Yamazaki et al. |
| 2008/0282984 A1 | 11/2008 | Yamazaki et al. |
| 2009/0020751 A1 | 1/2009 | Seki et al. |
| 2010/0171138 A1 | 7/2010 | Yamazaki et al. |
| 2010/0176720 A1 | 7/2010 | Yamazaki |
| 2010/0295052 A1 | 11/2010 | Yamazaki et al. |
| 2010/0320484 A1 | 12/2010 | Hirakata et al. |
| 2011/0266548 A1 | 11/2011 | Yamazaki et al. |
| 2011/0278578 A1 | 11/2011 | Yamazaki et al. |
| 2012/0256815 A1 | 10/2012 | Sato |
| 2013/0143345 A1 | 6/2013 | Yamazaki et al. |
| 2014/0027793 A1 | 1/2014 | Matsueda |

FOREIGN PATENT DOCUMENTS

| | | |
|---|---|---|
| CN | 001458640 A | 11/2003 |
| CN | 001588189 A | 3/2005 |
| EP | 0 989 778 A1 | 3/2000 |
| EP | 1 096 568 A2 | 5/2001 |
| EP | 1 102 317 A2 | 5/2001 |

(56) References Cited

FOREIGN PATENT DOCUMENTS

| | | |
|---|---|---|
| EP | 1 253 643 A2 | 10/2002 |
| EP | 1 369 499 A | 12/2003 |
| EP | 1 447 786 A1 | 8/2004 |
| EP | 1 536 494 A2 | 6/2005 |
| EP | 1 919 007 A2 | 5/2008 |
| EP | 2 259 323 A2 | 12/2010 |
| EP | 2 287 825 A2 | 2/2011 |
| JP | 11-339958 A | 12/1999 |
| JP | 2000-129419 A | 5/2000 |
| JP | 2000-195675 A | 7/2000 |
| JP | 2000-353594 A | 12/2000 |
| JP | 2001-093666 A | 4/2001 |
| JP | 2001-148291 A | 5/2001 |
| JP | 2001-195008 A | 7/2001 |
| JP | 2001-201750 A | 7/2001 |
| JP | 2001-345179 A | 12/2001 |
| JP | 2002-151252 A | 5/2002 |
| JP | 2002-164181 A | 6/2002 |
| JP | 2002-208484 A | 7/2002 |
| JP | 2002-287666 A | 10/2002 |
| JP | 2002-324666 A | 11/2002 |
| JP | 2003-059671 A | 2/2003 |
| JP | 2003-123969 A | 4/2003 |
| JP | 2003-207788 A | 7/2003 |
| JP | 2003-243171 A | 8/2003 |
| JP | 2003-257650 A | 9/2003 |
| JP | 2003-302917 A | 10/2003 |
| JP | 2003-317971 A | 11/2003 |
| JP | 2004-031262 A | 1/2004 |
| JP | 2004-063359 A | 2/2004 |
| JP | 2004-083650 A | 3/2004 |
| JP | 2004-127933 A | 4/2004 |
| JP | 2004-165067 A | 6/2004 |
| JP | 2004-192935 A | 7/2004 |
| JP | 2004-214010 A | 7/2004 |
| JP | 2005-148335 A | 6/2005 |
| JP | 2005-165324 A | 6/2005 |
| JP | 2005-322564 A | 11/2005 |
| KR | 2003-0027443 A | 4/2003 |
| WO | WO 03/044762 A1 | 5/2003 |
| WO | WO 2004/053816 A1 | 6/2004 |

OTHER PUBLICATIONS

Chinese Office Action re Application No. CN 201210063018.7, dated Feb. 24, 2014.

Chinese Office Action re Application No. CN 201210063018.7, dated Jan. 5, 2015.

Taiwanese Office Action re Application No. TW 103106253, dated Mar. 23, 2015.

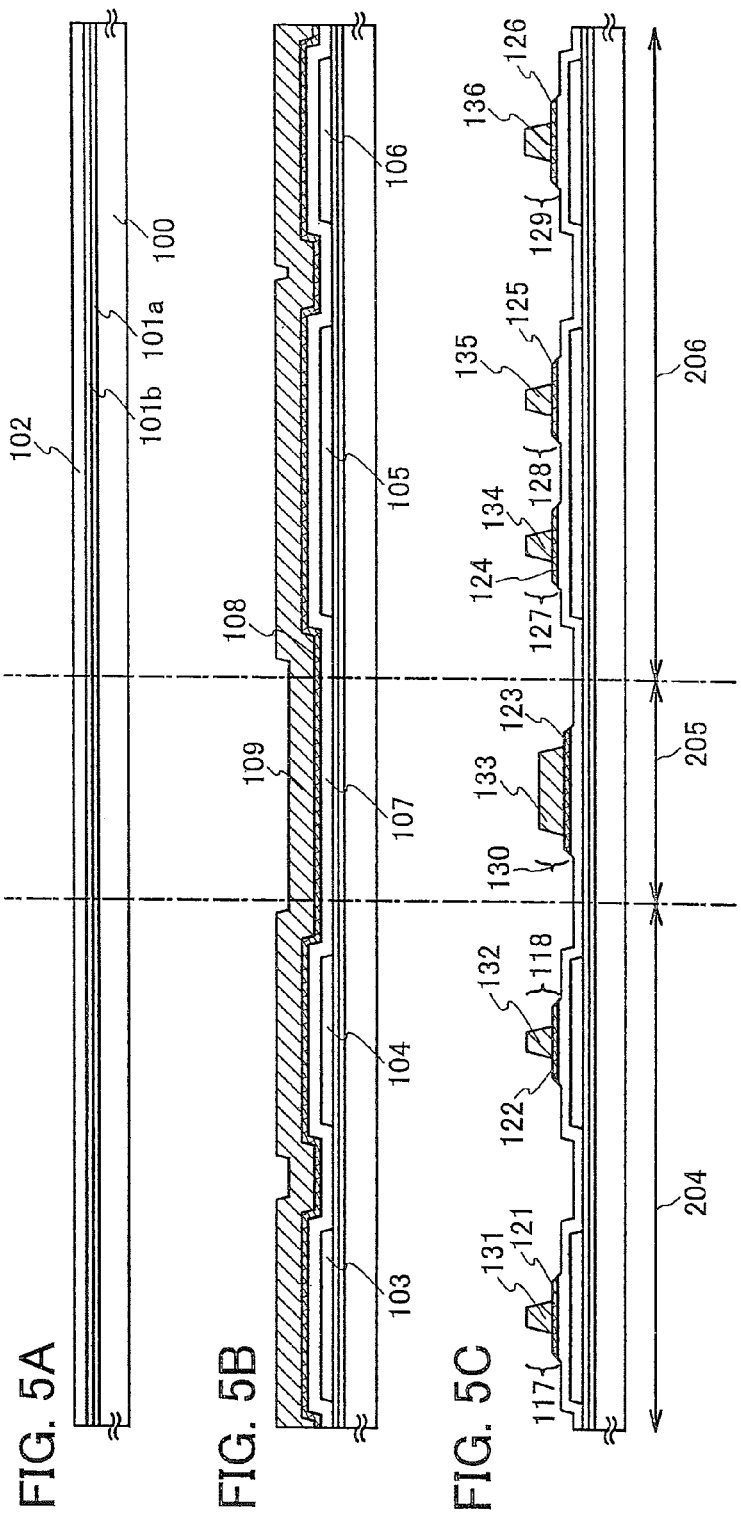

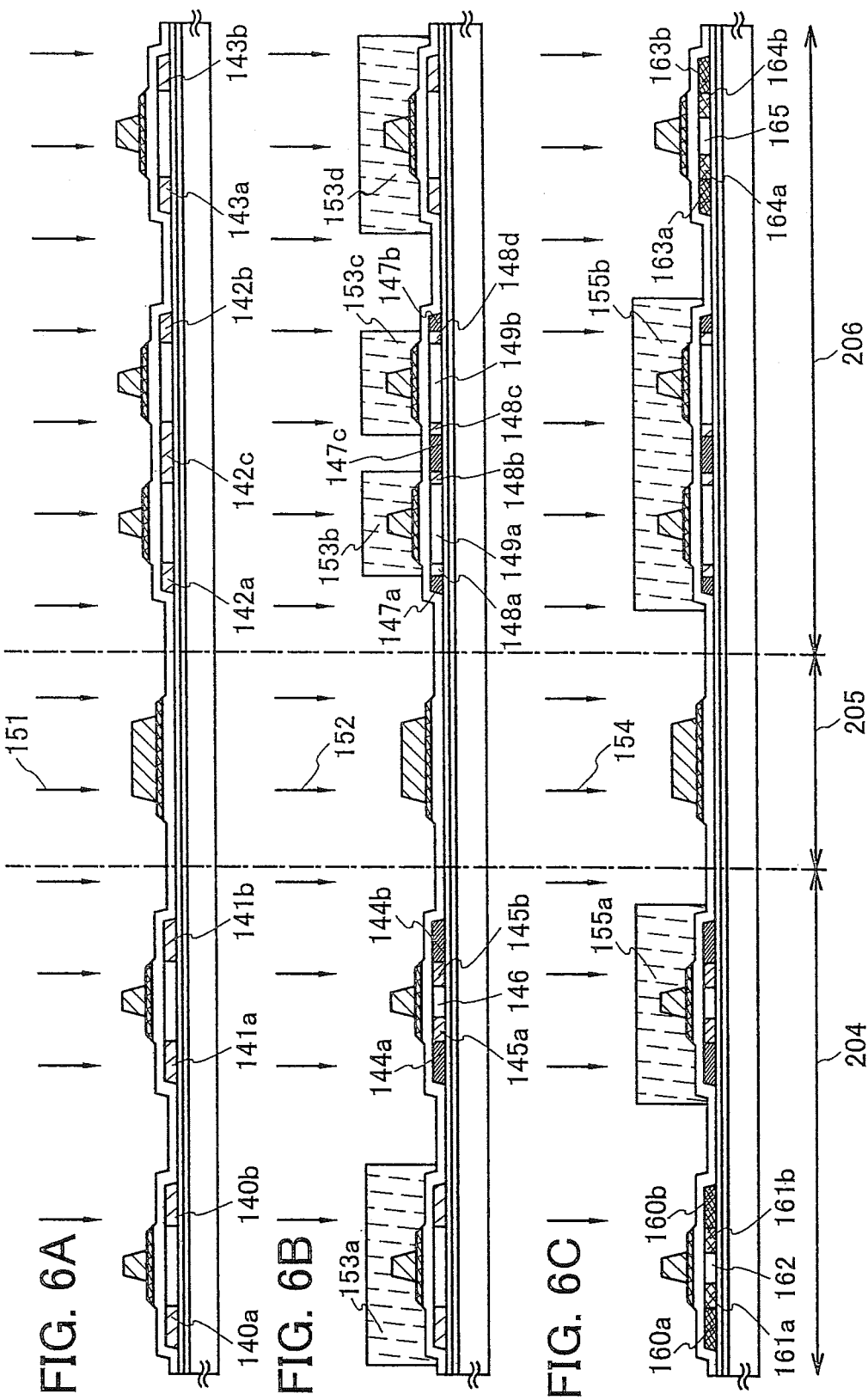

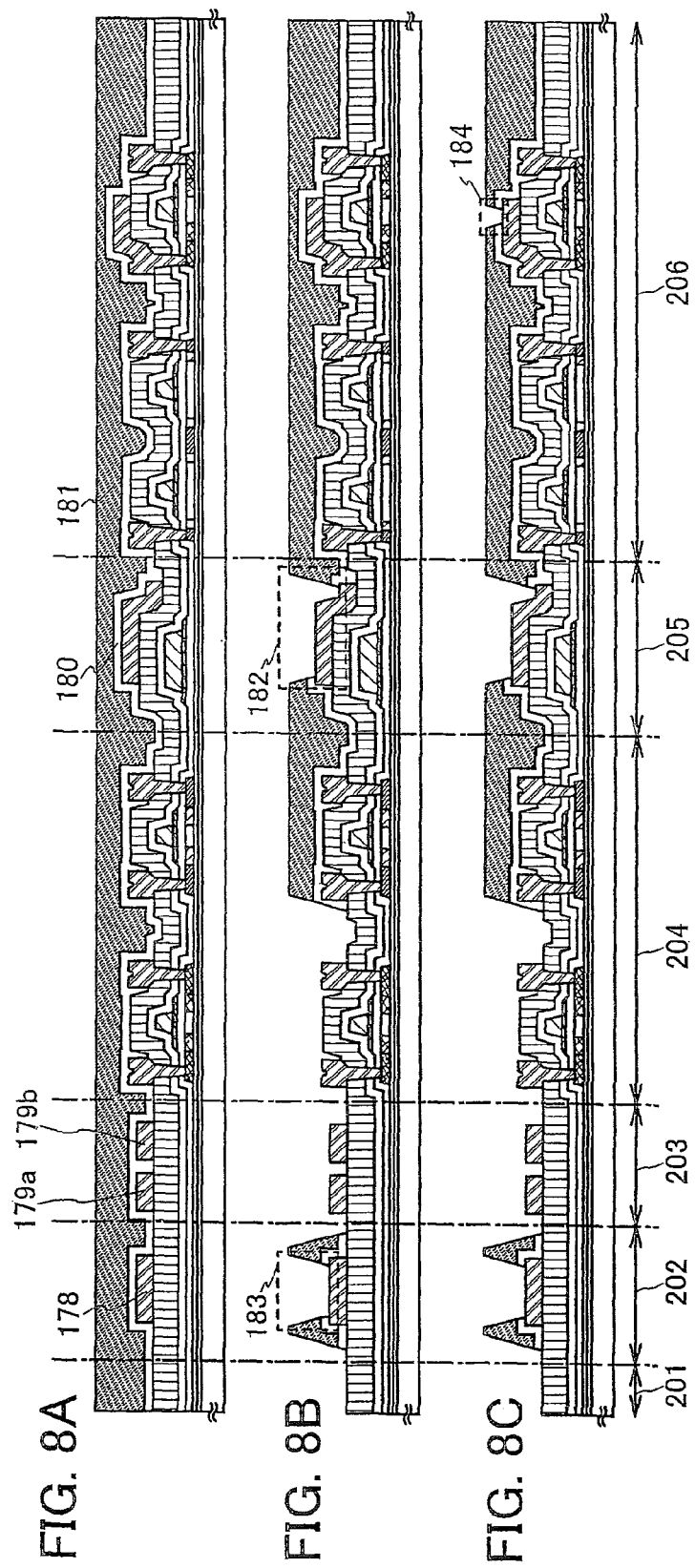

SEMICONDUCTOR DEVICE AND MANUFACTURING METHOD THEREOF

This application is a continuation of copending U.S. application Ser. No. 13/892,438 filed on May 13, 2013 which is a continuation of U.S. application Ser. No. 11/545,910 filed on Oct. 11, 2006 (now U.S. Pat. No. 8,441,185 issued May 14, 2013), all of which are incorporated herein by reference.

BACKGROUND OF THE INVENTION

1. Field of the Invention

The present invention relates to a light emitting device using a light emitting element which generates fluorescence or phosphorescence by applying an electric field to the element provided with a layer containing an organic compound (hereinafter referred to as an "organic compound layer") between a pair of electrodes, and a manufacturing method of the light emitting device. Note that the light emitting device refers to an image display device, a light emitting device, and a light source (including a lighting system).

2. Description of the Related Art

A light emitting element using an organic compound as a luminous body, which has features such as thinness, lightness, high-speed response, and DC drive at low voltage, is expected to be applied to a next-generation flat panel display. In particular, a display device in which light emitting elements are arranged in matrix is considered to have an advantage in a wide viewing angle and excellent visibility over a conventional liquid crystal display device.

It is said that as for a light emitting mechanism of the light emitting element, light is emitted by applying a voltage between a pair of electrodes where an organic compound layer is interposed, so that electrons injected from a cathode and holes injected from an anode are recombined with each other at a light emitting center of the organic compound layer to form molecular excitons and the molecular excitons release energy when returning to a ground state. Singlet excitation and triplet excitation are known as excited states, and it is thought that light emission can be achieved through either of the excited states.

For the light emitting device in which light emitting elements are arranged in matrix, a driving method such as passive matrix driving (simple matrix type) or active matrix driving (active matrix type) can be used. However, when the pixel density is increased, the active matrix type where each pixel (or each dot) is provided with a switch is thought to be advantageous because it can be driven at lower voltage.

In the case of manufacturing an active matrix light emitting device, a TFT is formed over a substrate having an insulating surface as a switching element, and EL elements each of which uses a pixel electrode electrically connected to the TFT as an anode or a cathode are arranged in matrix.

In the case of manufacturing an active matrix light emitting device or a passive matrix light emitting device, a partition for insulating adjacent pixels from each other is formed at an end portion of the pixel electrode.

The applicant of the present invention has proposed partitions disclosed in References 1 and 2 (Reference 1: Japanese Patent Laid-Open No. 2002-164181, and Reference 2: Japanese Patent Laid-Open No. 2004-127933).

In a display device provided with an electroluminescent (hereinafter also referred to as EL) element, a color light emitting element which emits color light is used in order to perform full-color display. It is one of important factors to form a light emitting material of each color over an electrode in a minute pattern in order to form a color light emitting element.

For the above purpose, a method for forming into a minute pattern using a mask is generally used when forming a material using an evaporation method or the like.

However, as a result of miniaturization of a pixel region associated with an improvement in definition and an increase in a substrate size associated with an increase in area, defects due to precision, bending, and the like of a mask used at the time of evaporation have become issues.

SUMMARY OF THE INVENTION

The present invention provides a structure which prevents a defect due to precision, bending, and the like of a mask used at the time of evaporation without increasing the number of steps.

Demands for higher definition, higher aperture ratio, and higher reliability on a full-color flat panel display using emission colors of red, green, and blue has been increased. Such demands are major issues in advancing miniaturization of each display pixel pitch associated with an improvement in definition (increase in the number of pixels) and a reduction in size of a light emitting device. It is necessary to reduce also the upper surface shape of a partition in order to improve definition of an active matrix light emitting device or a passive matrix light emitting device. The present invention provides a partition which realizes display with higher definition by reducing the upper surface shape and a light emitting device including that partition.

According to the present invention, a partition including portions with different thicknesses over a pixel electrode (also referred to as a first electrode) in a display region and in the vicinity of a pixel electrode layer is formed, without increasing the number of steps, by using a photomask or a reticle provided with an auxiliary pattern having a light intensity reduction function made of a diffraction grating pattern or a semi-transmissive film.

The partition of the present invention supports an evaporation mask with its thick portion, and prevents the evaporation mask from being in contact with the surface of a pixel electrode due to kinking, bending, or the like of the evaporation mask. Accordingly, the surface of the pixel electrode is not damaged by the mask and the pixel electrode does not have a defective shape. Therefore, a display device which can perform high-definition display and has high reliability can be manufactured. The thick portion may be formed selectively as long as it can prevent the evaporation mask from being in contact with the surface of the pixel electrode. In other words, one thick portion may be formed in a region where a plurality of pixels is arranged.

In addition, a thin portion of the partition of the present invention can suppress the generation of covering failure at the boundary of the pixel electrode and the partition in forming a layer containing an organic compound over the pixel electrode. Therefore, the partition of the present invention is particularly effective when forming an extremely thin layer containing an organic compound. The thickness of the thin portion of the partition is at least half or less that of the thick portion.

By adjusting the photomask or reticle provided with an auxiliary pattern having a light intensity reduction function made of a diffraction grating pattern or a semi-transmissive film, the width of the thick portion can be reduced, and the total width of the partition including the width of the thin portion can be less than 20 μm. In addition, even if pressure is applied from the evaporation mask at the time of evaporation when the width of the thick portion of the partition is set to approximately 5 µm, the strength is secured because the thin portions support the thick portion from both sides.

One configuration of the invention disclosed in this specification is a light emitting device having a plurality of light emitting elements over a substrate having an insulating surface, where the light emitting element includes a first electrode, a partition covering an end portion of the first electrode, a layer containing an organic compound over the first electrode, and a second electrode over the layer containing an organic compound, and the partition has a cross-sectional shape which spreads from an upper surface of the light emitting element toward the substrate, and has a step on a side of the partition.

In the above configuration, one feature is that an upper end portion of the partition is rounded. Being rounded at the upper end portion of the partition means that the partition has a curved surface determined depending on the center of curvature located inside the partition when cut along a plane perpendicular to the substrate plane and the curvature radius is 0.2 µm to 3 µm. In order to form the upper end portion of the partition to be rounded, a photosensitive resin is preferably used as a material of the partition and selectively exposed to light when forming the partition. Alternatively, the upper end portion of the partition may be rounded by wet etching. Further, in the cross-section of the partition, the partition has two curved surfaces determined depending on the centers of curvature located inside the partition at two portions, the upper end portion and the lower end portion, and also one curved surface determined depending on the center of curvature located outside the partition between the two portions.

In the above configuration, another feature is that the partition having a cross-sectional shape which spreads toward the bottom is a single layer. Since it does not have a stacked structure, a manufacturing process for the partition is simple.

In addition, as a means of solving the problem different from the above-described means, a structure which supports an evaporation mask may be formed around a pixel portion where a light emitting element is arranged, that is, a display region. In this specification, a protective layer formed between a certain light emitting element and another light emitting element is referred to as a partition. In addition, in this specification, an insulator which is located outside a light emitting element positioned apart from the center of a pixel portion and outside which the light emitting element is not positioned is referred to as a structure. When the area of a display region is small, an evaporation mask can be prevented from being in contact with the pixel electrode surface due to kinking, bending, and the like by forming a structure which supports the evaporation mask around the display region.

Another configuration of the present invention is a light emitting device including a pixel portion having a plurality of light emitting elements over a substrate having an insulating surface, where the light emitting element includes a first electrode, a partition covering an end portion of the first electrode, a layer containing an organic compound over the first electrode, and a second electrode over the layer containing an organic compound, where a structure made of the same material as the partition is arranged to surround the pixel portion, and a thickness of the structure and that of the partition are different from each other.

The structure can also be formed in the same step using the same material as the partition having a cross-sectional shape which spreads toward the bottom. In the above configuration, one feature is that the partition comprises a protruding portion. The partition has a cross-sectional shape which spreads from the upper surface of the light emitting element toward the substrate and has a step on a side of the partition.

In the case of sealing the light emitting element using an opposing substrate, the structure may serve to maintain a distance between a pair of substrates. In the above configuration, one feature is that the light emitting device includes a substrate opposed to the substrate having an insulating surface and the structure maintains a distance between the pair of substrates. This configuration is particularly effective when using a light transmitting substrate as the opposing substrate and performing display by passing light emitted from the light emitting element through the light transmitting substrate. Since the structure can maintain a uniform distance between the pair of substrates, high-definition display can be achieved.

In the above configuration, another feature is that a region surrounded by the structure and the pair of substrates is filled with a resin. This configuration is particularly effective when using a light transmitting substrate as the opposing substrate and performing display by passing light emitted from the light emitting element through the light transmitting substrate. In addition, by filling a space between the pair of substrates with a transparent resin, overall transmittance can be increased as compared to that of a space between the pair of substrates without being filled with anything (inert gas).

In addition to the above-described structure and the above-described partition, various structures such as a projection for improving adhesiveness when attaching to the sealing substrate can be formed in the same step using the same material.

A configuration of the invention for realizing the above-described configuration is a method for manufacturing a light emitting device, including the steps of forming a first electrode over a substrate having an insulating surface, forming a partition having a thick region and a thinner region using a photomask or a reticle having a diffraction grating pattern or a semi-transmissive portion over an end portion of the first electrode, forming a layer containing an organic compound over the first electrode, and forming a second electrode over the layer containing an organic compound.

In the above manufacturing steps, one feature is that the partition is a resin formed by selective light exposure and development using a photomask or a reticle having a diffraction grating pattern or a semi-transmissive portion.

In the above manufacturing steps, the step of forming the layer containing an organic compound over the first electrode is effective because a thick region of the partition can prevent bending or the like of the evaporation mask in the case of using an evaporation method, specifically, a resistance heating method using an evaporation mask. In addition, the layer containing an organic compound can be formed by a spin coating method, an ink-jet method, a dipping method, an electrolytic polymerization method, or the like without limitation to an evaporation method.

Another configuration of the invention related to a manufacturing method is a method for manufacturing a light emitting device having a plurality of thin film transistors and a plurality of light emitting elements over a substrate having an insulating surface, which includes the steps of forming a thin film transistor including a semiconductor layer having a source region, a drain region, and a channel formation region therebetween, a gate insulating film, and a gate electrode over a first substrate having an insulating substrate, forming a first electrode which is electrically connected to the source region or the drain region over the gate insulating film, forming a partition which covers an end portion of the first electrode, and a structure in a position surrounding the plurality of light emitting elements, forming a layer containing an organic compound over the first electrode, forming a second electrode over the layer containing an organic compound, and sealing the light emitting element by attaching a second substrate to the first substrate with a resin material so that the structure maintains a distance between the substrates.

In the manufacturing steps, one feature is that the partition and the structure are made of the same material and are resins formed by selective light exposure and development using a photomask or a reticle having a diffraction grating pattern or a semi-transmissive portion. Since the structure can be formed in the same step as the partition, it can be formed without increasing the number of steps.

The present invention can be applied to not only an active matrix light emitting device having a switching element but also a passive light emitting device.

Note that the light emitting device in this specification refers to an image display device, a light emitting device, or a light source (including a lighting system). Further, the light emitting device includes all of the following modules: a module having a light emitting device provided with a connector such as an FPC (Flexible Printed Circuit), a TAB (Tape Automated Bonding) tape, or a TCP (Tape Carrier Package); a module having a TAB tape or a TCP provided with a printed wiring board at the end thereof; and a module having an IC (Integrated Circuit) directly mounted on a light emitting element by a COG (Chip On Glass) method.

The present invention can prevent defects due to precision, bending, or the like of a mask used at the time of evaporation, without increasing the number of steps, by providing a partition which covers an end portion of the first electrode and a structure which surrounds a pixel portion.

In addition, the present invention can reduce the size of the partition, particularly, the plane area the partition occupies and can realize a small-sized partition and a light emitting device including the partition. In particular, as a distance between the evaporation mask and the first electrode is reduced using the partition, wraparound of an evaporated film can be suppressed and coloring accuracy of the evaporated film can be improved. Note that the wraparound of the evaporated film means the act of forming an evaporated film in a larger region than the area of an opening of an evaporation mask at the time of evaporation using the evaporation mask. The present invention can advance miniaturization of each display pixel pitch associated with an improvement in definition (increase in the number of pixels) and a reduction in size of a light emitting device. The partition of the present invention can reduce a distance between an evaporation mask and a first electrode and surely prevent contact between the first electrode and the evaporation mask. Therefore, an evaporation mask designed to be thinner can also be used.

BRIEF DESCRIPTION OF DRAWINGS

FIGS. 5A to 5C are diagrams showing a manufacturing process for a light emitting device.

FIGS. 6A to 6C are diagrams showing a manufacturing process for a light emitting device.

FIGS. 8A to 8C are diagrams showing a manufacturing process for a light emitting device.

DETAILED DESCRIPTION OF THE INVENTION

Figure 1A:
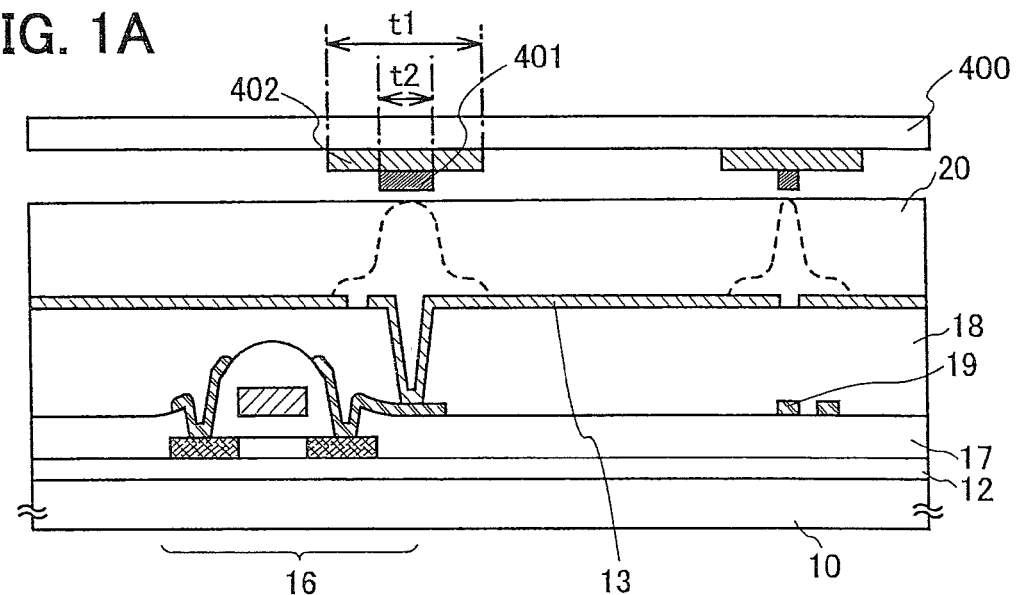
FIGS. 1A to 1C are cross-sectional views showing a process of the present invention.

Embodiment modes of the present invention are hereinafter explained in detail with reference to the accompanying drawings. However, the present invention is not limited to the following explanation. As is easily known to a person skilled in the art, the mode and the detail of the present invention can be variously changed without departing from the spirit and the scope of the present invention. Therefore, the present invention is not interpreted as being limited to the following description of the embodiment modes. Note that the same reference numeral is used to denote the same portion or a portion having a similar function among different diagrams in a structure of the present invention to be explained below, and repetitive explanation is omitted.

Embodiment Mode 1

Here, the present invention is explained using an example of an active matrix light emitting device.

Figure 1B:
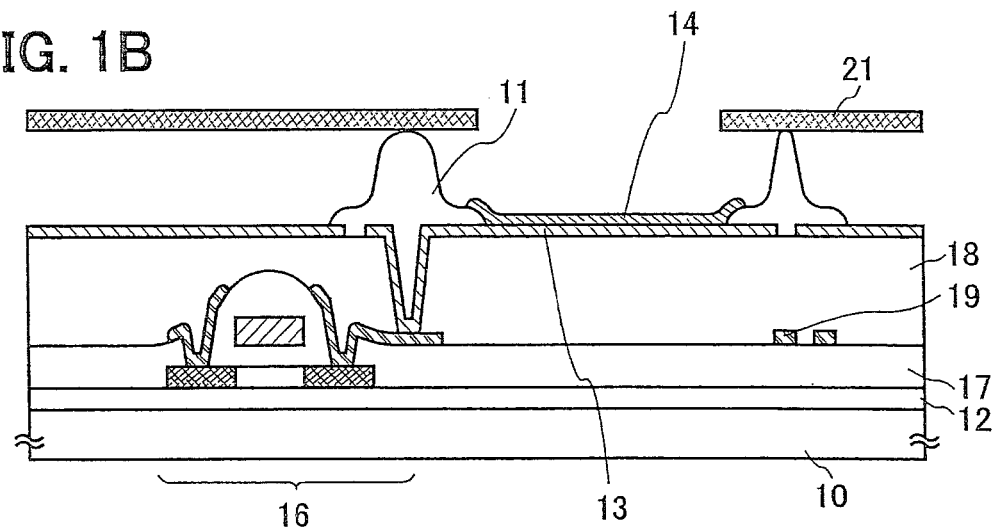
Figure 1C:
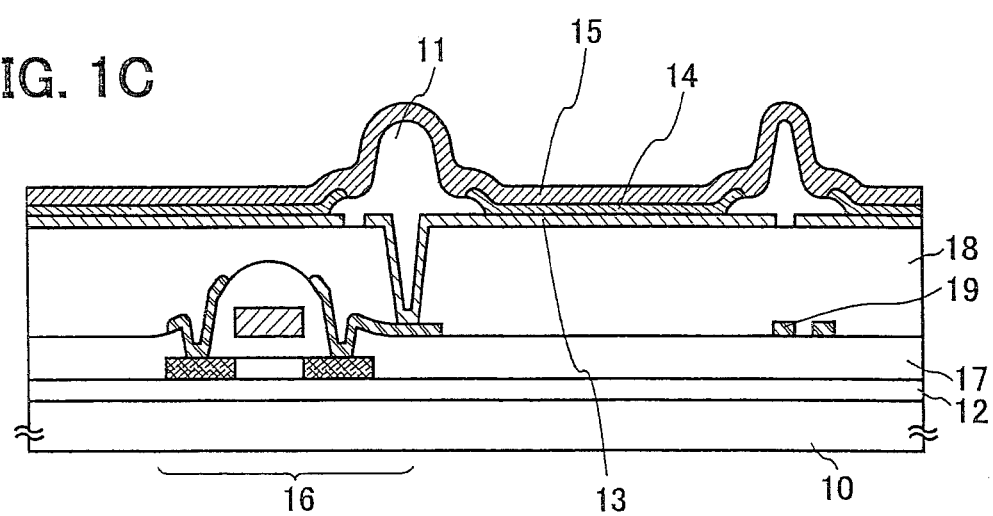

In addition, an example of a manufacturing process for obtaining a structure of FIG. 1C is hereinafter described.

First, a TFT 16 is manufactured over a substrate 10 having an insulating surface. As for a base insulating film 12 of the TFT 16 and a stacked layer 17 of insulating films including a gate insulating film, an inorganic material (such as silicon oxide, silicon nitride, silicon oxynitride, a SiOF film, or a SiONF film) obtained by a sputtering method or a PCVD method is used. As for an insulating film 18 functioning as an interlayer insulating film, an inorganic material (such as silicon oxide, silicon nitride, silicon oxynitride, a SiOF film, or a SiONF film) obtained by a sputtering method, a PCVD method, or a coating method; a photosensitive or non-photosensitive organic material (such as polyimide, acrylic, polyamide, polyimide amide, a resist, or benzocyclobutene) obtained by a coating method; an SOG film (an insulating film having a siloxane structure) obtained by a coating method; a stacked layer thereof; or the like can be appropriately used. As for the TFT 16, an n-channel TFT or a p-channel TFT may be manufactured by a known method.

Next, an opening is formed to reach an electrode of the TFT by etching the insulating film 18, and then a first electrode 13 serving as an anode is formed so as to overlap with the electrode of the TFT. Here, the first electrode 13 is formed using a conductive film having a high work function (such as an indium tin oxide (ITO) film, an alloy film of indium oxide and zinc oxide ($In_2O_3$—ZnO), or a zinc oxide (ZnO) film) by wet etching. In selectively etching the first electrode 13, etching conditions or materials are appropriately set so as to be able to have a selection ratio with the insulating film 18.

Subsequently, an insulating film is entirely formed by a coating method, and then a partition 11 is formed using a photomask or a reticle provided with an auxiliary pattern having a light intensity reduction function made of a diffraction grating pattern or a semi-transmissive film. The partition 11 is formed in a position which overlaps with the opening reaching the electrode of the TFT. It is preferable to form the partition 11 in a position which overlaps with the opening reaching the electrode of the TFT because adhesiveness between the partition and the first electrode is improved. Here, an example of entirely forming a photosensitive resin film 20 and then exposing it to light by using a photomask provided with an auxiliary pattern having a light intensity reduction function made of a semi-transmissive film is described with reference to FIG. 1A.

In FIG. 1A, a light exposure mask 400 is provided with a light blocking portion 401 made of a metal film such as Cr, and a portion provided with a semi-transmissive film (also referred to as a semi-transmissive portion) 402 as an auxiliary pattern having a light intensity reduction function. In the cross-sectional view of the light exposure mask, the width of the light blocking portion 401 is denoted by t2 and the width of the portion 402 provided with a semi-transmissive film is denoted by t1. A portion of the portion 402 provided with a semi-transmissive film overlapped with the light blocking portion 401 does not transmit light. Here, the example of using a semi-transmissive film as a part of the light exposure mask is described; however, a diffraction grating pattern may be used.

When the photosensitive resin film 20 is exposed to light using the light exposure mask shown in FIG. 1A, a light-unexposed region and a light-exposed region are formed. At the time of light exposure, light passes around the light blocking portion 401 and passes through the portion 402 provided with a semi-transmissive film, so that a light-exposed region indicated by dotted lines in FIG. 1A is formed. Then, the partition 11 having a cross-sectional shape which spreads toward the bottom is formed by removing the light-exposed region. In other words, the partition 11 includes a thick portion and a thin portion as shown in FIG. 1A. The thin portion of the partition is formed to have a thickness at least half or less that of the thick portion. Note that the thick portion refers to a portion where a thickness measured from a flat surface of the insulating film 18 is large. When the height of the partition 11 (that is, the height of the thick portion) is 2 or more, defective coverage tends to be generated. Therefore, the height of the partition 11 is preferably small (less than 2 μm). As shown in FIG. 1A, a partition having a different width from the partition 11 overlapping with the opening reaching the electrode of the TFT is formed above a wire 19.

Hereinabove, the example of forming the partition using the photosensitive resin film 20 is described; however, the partition 11 having a cross-sectional shape which spreads toward the bottom may be formed by entirely forming an insulating film, forming a resist mask using a photomask or a reticle provided with an auxiliary pattern having a light intensity reduction function made of a diffraction grating pattern or a semi-transmissive film, and performing etching using the resist mask as a mask.

Next, a layer 14 containing an organic compound is formed by an evaporation method. In the case of forming by an evaporation method, the layer 14 containing an organic compound is selectively formed using an evaporation mask 21 as shown in FIG. 1B. Note that FIG. 1B shows upside down with respect to the actual evaporation direction. In the case of performing evaporation, a substrate is sandwiched between a substrate holder and an evaporation mask; a permanent magnet provided in the substrate holder attracts the evaporation mask made of metal and fixes the substrate; and evaporation is performed with an evaporation source located below an exposed surface of the first electrode.

Although FIG. 1B shows the layer 14 containing an organic compound as a single layer, the layer 14 containing an organic compound has a stacked structure of a hole injection layer (or a hole transport layer), a light emitting layer, an electron injection layer (or an electron transport layer), and the like. Note that in order to improve reliability, deaeration is preferably performed by performing vacuum heating (100° C. to 250° C.) shortly before forming the layer 14 containing an organic compound. For example, in the case of using an evaporation method, evaporation is performed in a film formation chamber which is evacuated to a vacuum of $5 \times 10^{-3}$ Torr (0.665 Pa) or less, preferably, $10^{-4}$ Pa to $10^{-6}$ Pa. In evaporation, an organic compound is vaporized in advance by resistance heating and scattered toward the substrate when a shutter is opened at the time of evaporation. The vaporized organic compound is scattered upwards and evaporated over the substrate through an opening provided in an evaporation mask.

Figure 2A:
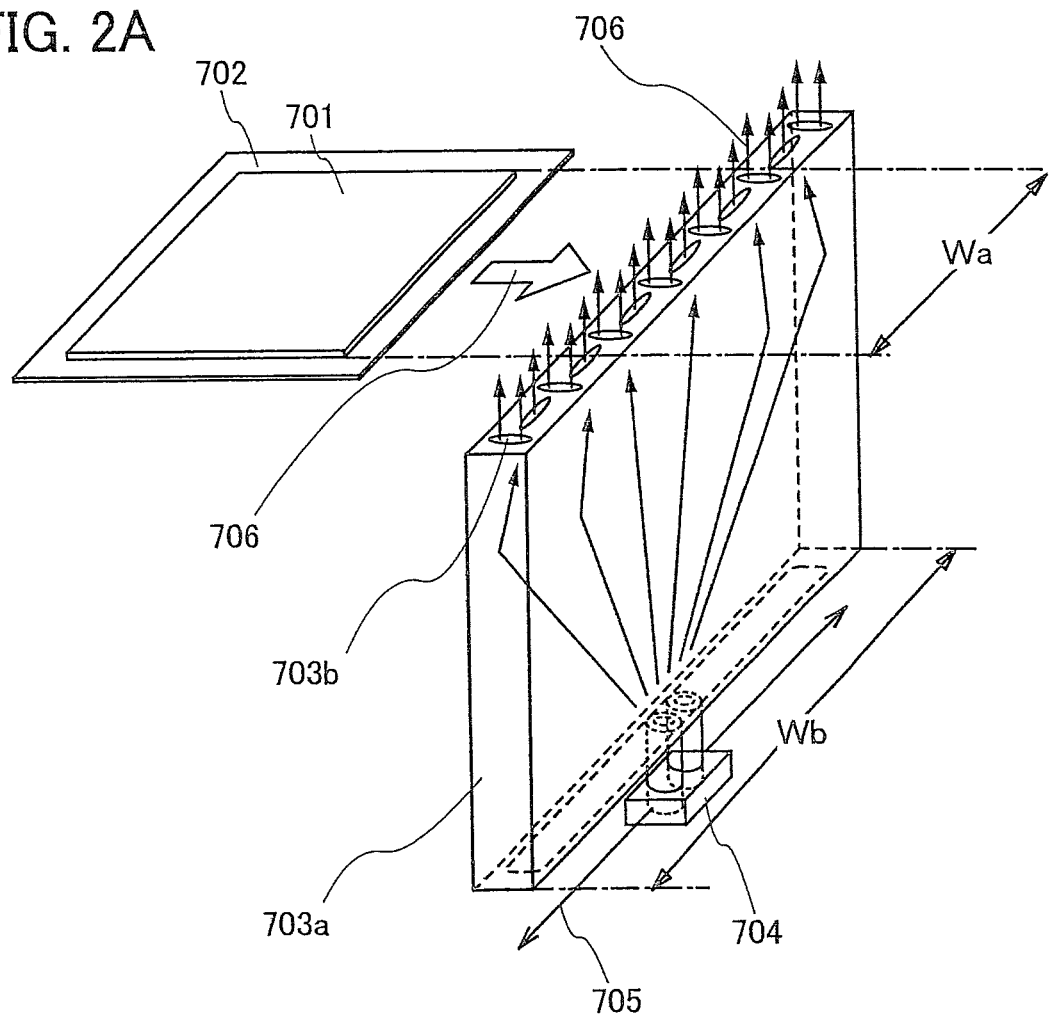
FIGS. 2A and 2B are diagrams showing an example of an evaporation apparatus.
Figure 2B:
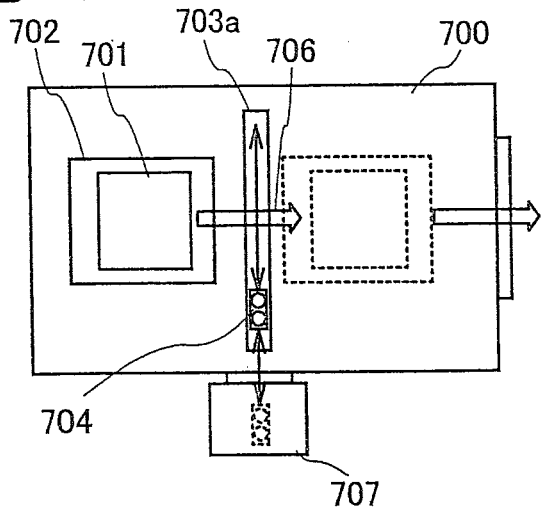

FIGS. 2A and 2B show an example of an evaporation apparatus.

The evaporation apparatus shown in FIG. 2A includes a film formation chamber provided with an evaporation shield for maintaining a sublimation direction of an evaporation material, and the evaporation shield is provided with a plurality of openings. The evaporation material is sublimated through the plurality of openings. An evaporation source which is movable in a direction perpendicular to the moving direction (also referred to as a transfer direction) of a substrate is provided under the evaporation shield. Further, the width Wb of the evaporation shield is broader than the width Wa of the substrate, so that uniformity of the thickness of an evaporated film is improved. The mechanism of the evaporation apparatus is briefly described below.

A substrate 701 is aligned with an evaporation mask 702 in advance. The substrate is transferred to the direction indicated by an arrow (sublimation direction 706 of an evaporation material) in the aligned state. The substrate is transferred so as to pass over an evaporation shield 703a. The evaporation shield 703a has an opening 703b, and an evaporation material from an evaporation source 704 is sublimated through the opening 703b. The evaporation shield 703a is heated so that the evaporation material does not attach to the evaporation shield itself, in order to maintain the sublimation direction 706 of the evaporation material from the opening 703b.

The evaporation source 704 can be provided with a plurality of crucibles, and can be moved in the direction indicated by an arrow (a moving direction 705 of the evaporation source). A resistance-heating method is used as an evaporation method. Further, the range of movement of the evaporation source is desirably broader than the width Wa of the substrate. Further, the width Wb of the evaporation shield is also preferably broader than the width Wa of the substrate, so that uniformity of the thickness of an evaporated film is improved.

Note that, in the evaporation apparatus of FIG. 2A, the shape and the number of the openings 703b are not limited in particular.

In order to supply an evaporation material to the crucible in the evaporation source, a setting chamber may be provided which connects to the film formation chamber through a gate. Further, a plurality of evaporation sources and evaporation shields may be provided in one film formation chamber. A top view of an evaporation apparatus in which one evaporation source provided with a plurality of crucibles and a setting chamber are provided, is shown in FIG. 2B. A setting chamber 707 is provided in the moving direction 705 of the evaporation source. The evaporation material may be supplied by moving the evaporation source to the setting chamber. In the case where the evaporation source is fixed to the film formation chamber, the film formation chamber needs to be at an atmospheric pressure to supply the evaporation material to the evaporation source. Therefore, it takes time to evacuate the film formation chamber for re-evaporation. When the setting chamber 707 is provided, atmospheric pressure and vacuum can be switched only in the setting chamber 707 while the vacuum is kept in the film formation chamber 700; thus, the evaporation material can be supplied in a short time.

Although the example of providing one film formation chamber with one evaporation source is described here, one film formation chamber may be provided with two or more evaporation sources.

In evaporation, the thick portion, that is, the top of the partition 11 is in contact with the evaporation mask and functions to maintain a distance. When the partition 11 is arranged so as to surround the first electrode, evaporation onto a region below the mask where an opening is not provided, for example, an adjacent pixel can be prevented. Note that the partition 11 is formed on the insulating film 18 to surround an end portion of each first electrode, and the first electrode is insulated from an adjacent first electrode and prevented from short-circuiting. In addition, the thick portion, that is, the top of the partition 11 overlaps with the opening reaching the electrode of the TFT.

Since an aperture ratio is decreased when the width of this partition 11 is large, it is preferable to improve an aperture ratio and definition by minimizing an upper surface shape of the partition. In addition, by overlapping the layer 14 containing an organic compound with the thin portion of the partition 11, the first electrode formed below the partition and a second electrode to be formed later can be effectively prevented from short-circuiting. In other words, a portion of the layer 14 containing an organic compound which is overlapped with the partition 11, that is, a portion which does not contribute to light emission functions also as a part of the partition.

Next, the second electrode 15 serving as a cathode is formed over the layer 14 containing an organic compound. An evaporation mask is used also when forming the second electrode 15. When an opening of the evaporation mask corresponds to an entire pixel portion, a structure formed in a portion other than the pixel portion maintains a distance to the evaporation mask.

Through the above steps, a structure shown in FIG. 1C can be obtained. In addition, a resistance heating method which does not damage the TFT 16 is preferable as a method for forming the layer 14 containing an organic compound and the second electrode 15, and a coating method (such as an ink-jet method or a spin coating method) can also be used. Further, the layer 14 containing an organic compound may be stacked with a film formed by a coating method and a film formed by an evaporation method. For example, after applying a poly(ethylene dioxythiophene)/poly(styrenesulfonic acid) aqueous solution (PEDOT/PSS), a polyaniline/camphor sulfonate aqueous solution (PANI/CSA), PTPDES, Et-PTPDEK, PPBA, or the like which functions as a hole injection layer by a spin coating method and baking the same, a light emitting layer, an electron transport layer, or the like may be stacked by an evaporation method.

In FIG. 1C, a reference numeral 10 denotes a substrate; 11, a partition; 12, a base insulating film; 13, a first electrode; 14, a layer containing an organic compound; 15, a second electrode; 16, a TFT; 17, a stacked layer of insulating films including a gate insulating film; 18, an insulating film; and 19, a wire such as a power supply line. Note that in FIG. 1C, the first electrode 13 is formed to function as an anode of a light emitting element and the second electrode is formed to function as a cathode. However, there is no particular limitation, and the first electrode can be formed to function as a cathode and the second electrode can be formed to function as an anode by appropriately selecting a material.

In addition, the present invention is not limited to the TFT structure of FIG. 1A, and a lightly doped drain (LDD) structure having an LDD region between a channel formation region and a drain region (or a source region) may be employed if necessary. In this structure, a region to which an impurity element is added at low concentration is provided between a channel formation region and a source or drain region which is formed by adding an impurity element at high concentration, and this region is referred to as an LDD region. Furthermore, a so-called GOLD (Gate-drain Overlapped LDD) structure, in which an LDD region is overlapped with a gate electrode with a gate insulating film interposed therebetween, may be employed.

In addition, although explanation is made here using an n-channel TFT, it is needless to say that a p-channel TFT can be formed by using an impurity element which imparts p-type conductivity instead of an impurity element which imparts n-type conductivity.

Furthermore, although an example is explained here using a top-gate TFT, the present invention can be applied regardless of a TFT structure. For example, the present invention can be applied to a bottom-gate (inversed staggered) TFT or a forward staggered TFT.

In this specification, as a semiconductor layer serving as an active layer of the TFT, a semiconductor film containing silicon as its main component, a semiconductor film containing an organic material as its main component, or a semiconductor film containing metal oxide as its main component can be used. As the semiconductor film containing silicon as its main component, an amorphous semiconductor film, a semiconductor film including a crystalline structure, a compound semiconductor film including an amorphous structure, or the like can be used. Specifically, as for the semiconductor film containing silicon as its Main component, amorphous silicon, microcrystalline silicon, polycrystalline silicon, or the like can be used. As the semiconductor film containing an organic material as its main component, a semiconductor film containing, as its main component, a substance which includes a certain amount of carbon or an allotrope of carbon (excluding diamond) in combination with another element can be used. Specifically, pentacene, tetracene, a thiophen oligomer derivative, a phenylene derivative, a phthalocyanine compound, a polyacetylene derivative, a polythiophene derivative, a cyanine pigment, or the like can be used. Further, as the semiconductor film containing metal oxide as its main component, zinc oxide (ZnO); oxide of zinc, gallium, and indium (In—Ga—Zn—O); or the like can be used.

Embodiment Mode 2

Figure 3:
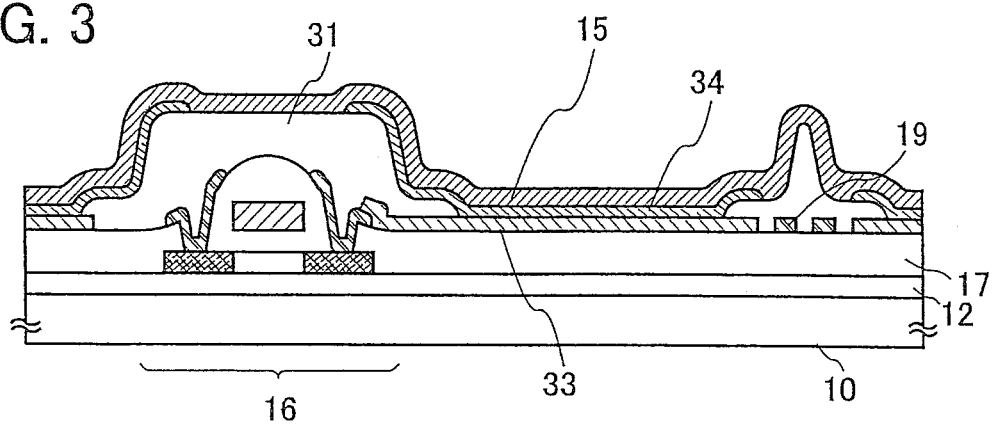
FIG. 3 is a diagram showing an example of a cross-sectional structure of the present invention.

This embodiment mode describes an example of a structure which is partially different from that of Embodiment Mode 1 with reference to FIG. 3.

Here, a structure in which one layer of the interlayer insulating film in FIGS. 1A to 1C is reduced, specifically, a structure in which the insulating film 18 shown in FIGS. 1A to 1C is not formed is described. Note that in FIG. 3, the same reference numeral is used to denote the same portion as that in FIGS. 1A to 1C.

Similarly to Embodiment Mode 1, a TFT 16 is manufactured over a substrate 10 having an insulating surface. Next, a first electrode 33 serving as an anode is formed over a stacked layer 17 of insulating films including a gate insulating film. The first electrode 33 is formed over the stacked layer 17 of insulating films including a gate insulating film so as to be partially in contact with and overlapped with an electrode electrically connected to a source region or a drain region of the TFT.

Next, an insulating film is entirely formed by a coating method, and then a partition 31 is formed using a photomask or a reticle provided with an auxiliary pattern having a light intensity reduction function made of a diffraction grating pattern or a semi-transmissive film. The partition 31 includes a thick portion and a thin portion. In addition, the partition 31 is provided on the stacked layer 17 of insulating films including a gate insulating film, and is in contact with and covers a wire 19 such as a power supply line.

Next, a layer 34 containing an organic compound is formed by an evaporation method. Although FIGS. 1A to 1C show an example in which the layer 14 containing an organic compound is overlapped with the thin portion of the partition 11, FIG. 3 shows an example in which the layer 34 containing an organic compound is overlapped also with the thick portion of the partition 31. The layer 34 containing an organic compound is overlapped also with the thick portion of the partition 31 as shown in FIG. 3 because an evaporation mask is used of which the width of a shielding portion is smaller than that of the thick portion of the partition 31 in a cross section taken perpendicularly to the substrate plane. In the present invention, the width of the shielding portion of the evaporation mask may be smaller than, the same as, or larger than the width of the partition. Further, by overlapping the layer 34 containing an organic compound also with the thick portion of the partition 31, the TFT formed below the partition and a second electrode to be formed later can be effectively prevented from short-circuiting.

Next, a second electrode 15 serving as a cathode is formed over the layer 34 containing an organic compound.

Through the above steps, the structure shown in FIG. 3 can be obtained.

Thus, the structure shown in FIG. 3 can be manufactured through fewer steps than those shown in FIGS. 1A to 1C.

This embodiment mode can be freely combined with Embodiment Mode 1.

Embodiment Mode 3

This embodiment mode describes an example of providing a partition in a pixel portion where a plurality of light emitting elements is arranged (also referred to as a display region) and a structure arranged to surround the pixel portion.

Figure 4A:
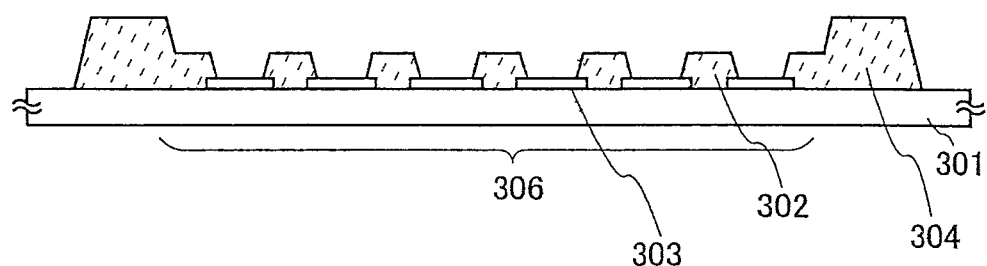
FIGS. 4A and 4B are diagrams showing an example of a cross-sectional structure of the present invention.

Here, an example of manufacturing a passive matrix light emitting device is described with reference to FIGS. 4A and 4B.

A first electrode 303 is formed over a first substrate 301, and a partition 302 is formed to cover an end portion of the first electrode 303. In addition, a structure 304 is formed in the same step as the partition 302. The partition 302 and the structure 304 have different thicknesses. A cross-sectional view at this stage is shown in FIG. 4A.

Next, a layer 305 containing an organic compound is formed over the first electrode 303, and a second electrode 307 is formed thereover. Note that in forming the layer 305 containing an organic compound by an evaporation method, the structure 304 can prevent an evaporation mask and the first electrode 303 from being in contact with each other. In addition, the structure 304 can also prevent the evaporation mask and the partition 302 from being in contact with each other.

Then, sealing is performed by attaching a second substrate 308 to the first substrate 301 with an adhesive layer 309.

Figure 4B:
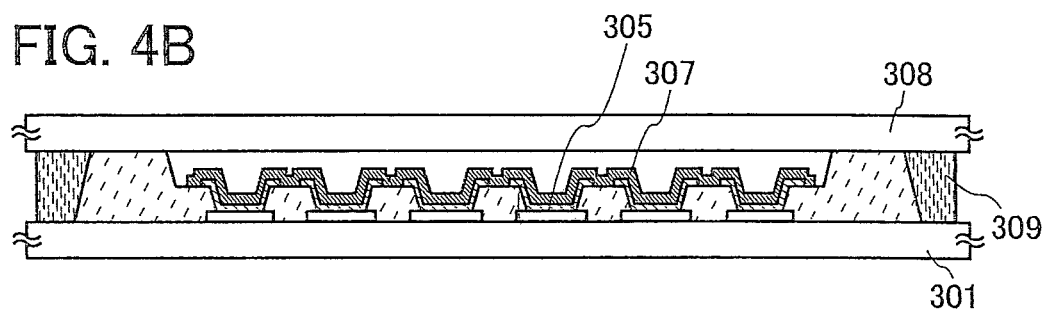

As shown in FIG. 4B, the structure 304 arranged over the first substrate 301 to surround a pixel portion 306 can maintain a distance between a pair of substrates when sealing is performed using the second substrate 308. In addition, the pixel portion can also be sealed by sealing a region surrounded by the structure and the pair of substrates. In other words, the structure 304 can prevent the entry of an impurity and moisture from the outside.

The partition 302 and the structure 304 are formed in the same step using a photomask or a reticle including a diffraction grating pattern or a semi-transmissive portion.

In the case of manufacturing an active matrix light emitting device, a partition which is provided in a pixel portion where a plurality of light emitting elements is arranged (also referred to a display region) and a structure which is arranged to surround the pixel portion may be similarly formed.

In the case of manufacturing an active matrix light emitting device, a part of a driver circuit can also be formed with a TFT in the same step as a TFT arranged in a pixel. In that case, the driver circuit is arranged around the pixel portion. In addition, the structure may be formed in a position overlapped with the driver circuit.

This embodiment mode can be freely combined with Embodiment Mode 1 or 2.

For example, by forming the partition into a shape which spreads toward the bottom and forming a part of the partition to have the same thickness as the structure, a distance between the pair of substrates can be maintained with both the partition and the structure. In the case of providing a partition having such an upper surface shape as to surround one pixel, sealing can be performed by sealing one pixel with the second substrate and the partition, and sealing can be performed by further sealing the periphery with the structure. By performing sealing twice as described above, a light emitting device with high reliability can be achieved. When the light emitting device is subjected to external impact, the force of the impact can be dispersed because the pair of substrates is supported with the partition and the structure. Therefore, a durable light emitting device can be provided.

Embodiment Mode 4

This embodiment mode describes steps of forming a TFT, entirely forming a photosensitive resin film, forming a partition using a photomask provided with an auxiliary pattern having a light intensity reduction function made of a semi-transmissive film, up to the completion of a light emitting device.

First, over a substrate 100 having an insulating surface, a base film 101a is formed using a silicon nitride oxide (SiNO) film with a thickness of 10 nm to 200 nm (preferably, 50 nm to 100 nm) and a base film 101b is stacked thereover using a silicon oxynitride (SiON) film with a thickness of 50 nm to 200 nm (preferably, 100 nm to 150 nm) by a sputtering method, a PVD (Physical Vapor Deposition) method, a CVD (Chemical Vapor Deposition) method such as a low pressure CVD (LPCVD) method or a plasma CVD method, or the like. In this embodiment mode, the base film 101a and the base film 101*b* are formed using a plasma CVD method. As the substrate 100, a glass substrate, a quartz substrate, or a silicon substrate, a metal substrate, or a stainless steel substrate provided with an insulating film on the surface may be used. In addition, a plastic substrate having heat resistance sufficient to withstand a processing temperature of this embodiment mode may be used, or a flexible film-like substrate may be used. As the plastic substrate, a substrate made of PET (polyethylene terephthalate), PEN (polyethylenenaphthalate), or PES (polyethersulfone) can be used, and as the flexible substrate, a synthetic resin such as acrylic can be used.

The base film can be formed using silicon oxide, silicon nitride, silicon oxynitride, silicon nitride oxide, or the like and it may have either a single-layer structure or a stacked structure of two or more layers. In this specification, silicon oxynitride refers to a substance having a higher composition ratio of oxygen than that of nitrogen, and can also be referred to as silicon oxide containing nitrogen. Similarly, silicon nitride oxide refers to a substance having a higher composition ratio of nitrogen than that of oxygen, and can also be referred to as silicon nitride containing oxygen. In this embodiment mode, over the substrate, a silicon nitride oxide film is formed with a thickness of 50 nm using $SiH_4$, $NH_3$, $N_2O$, $N_2$, and $H_2$ as a reaction gas, and a silicon oxynitride film is formed with a thickness of 100 nm using $SiH_4$ and $N_2O$ as a reaction gas. The thickness of the silicon nitride oxide film may be 140 nm and the thickness of the silicon oxynitride film to be stacked may be 100 nm.

Next, a semiconductor film is formed over the base film. The semiconductor film may be formed with a thickness of 25 nm to 200 nm (preferably, 30 nm to 150 nm) by a known method (such as a sputtering method, an LPCVD method, or a plasma CVD method). In this embodiment mode, a crystalline semiconductor film formed by crystallizing an amorphous semiconductor film with a laser beam is preferably used. In the case of using a crystalline semiconductor film, the crystalline semiconductor film may be formed using a known method (such as a laser crystallization method, a thermal crystallization method, or a thermal crystallization method using an element which promotes crystallization such as nickel).

A crystal with a large grain size can be obtained by irradiation with laser light of the second to fourth harmonic of a fundamental wave using a solid-state laser capable of continuous oscillation. Typically, it is desirable that the second harmonic (532 nm) or the third harmonic (355 nm) of a Nd:$YVO_4$ laser (fundamental wave: 1064 nm) be used. Specifically, laser light with an output of several W or more is obtained by converting laser light emitted from a continuous-wave $YVO_4$ laser into a harmonic by a nonlinear optical element. Then, it is preferable to shape the laser light into a rectangular or elliptical shape on an irradiation surface by an optical system and irradiate the semiconductor film with the laser light. A power density at this time needs to be approximately 0.001 $MW/cm^2$ to 100 $MW/cm^2$ (preferably, 0.1 $MW/cm^2$ to 10 $MW/cm^2$). Subsequently, irradiation is performed with a scan rate of approximately 0.5 cm/sec to 2000 cm/sec (preferably, 10 cm/sec to 200 cm/sec).

The beam shape of the laser is preferably linear. Accordingly, throughput can be improved. Further, the semiconductor film is preferably irradiated with the laser with an incident angle θ (0°<θ<90°). This is because laser interference can be prevented.

Laser irradiation can be performed by moving such a laser relative to the semiconductor film. In addition, a marker can be formed to overlap beams with accuracy or to control a laser irradiation start position and a laser irradiation termination position in laser irradiation. The marker may be formed over the substrate at the same time as the amorphous semiconductor film.

As the laser, a continuous-wave or pulsed gas laser, solid-state laser, copper vapor laser, gold vapor laser, or the like can be used. As the gas laser, an excimer laser, an Ar laser, a Kr laser, a He—Cd laser, or the like can be used, and as the solid-state laser, a YAG laser, a $YVO_4$ laser, a YLF laser, a $YAlO_3$ laser, a $Y_2O_3$ laser, a glass laser, a ruby laser, an alexandrite laser, a Ti:sapphire laser, or the like can be used.

As a material for forming the semiconductor film, an amorphous semiconductor (hereinafter also referred to as an "AS") manufactured by a vapor phase growth method or a sputtering method using a semiconductor material gas typified by silane or germane; a polycrystalline semiconductor that is formed by crystallizing the amorphous semiconductor by utilizing light energy or thermal energy; a semiamorphous (also referred to as microcrystalline or microcrystal) semiconductor (hereinafter also referred to as a "SAS"); or the like can be used.

In addition, laser crystallization may be performed using a pulsed laser beam with a repetition rate of 0.5 MHz or more and using a frequency band which is much higher than a generally used frequency band, several tens to several hundreds Hz. It is said that the time required for the semiconductor film irradiated with pulsed laser light to solidify completely is several tens nsec to several hundreds nsec. By using the above frequency band, the semiconductor film can be irradiated with pulsed laser light after being melted by the previous laser light and before being solidified. Accordingly, the interface between the solid phase and the liquid phase can be moved continuously in the semiconductor film; therefore, a semiconductor film having crystal grains grown continuously in the scanning direction is formed. Specifically, a cluster of crystal grains of which width in a scanning direction is 10 μm to 30 μm and width in a direction perpendicular to the scanning direction is approximately 1 μm to 5 μm can be formed. By forming crystal grains of a single crystal which extend long along the scanning direction, a semiconductor film can be formed in which crystal grain boundaries hardly exist at least in a channel direction of a thin film transistor.

The laser light irradiation may be performed in an inert gas atmosphere such as a noble gas or nitrogen. This can suppress roughness of a semiconductor surface caused by the laser light irradiation and suppress variations in the threshold caused by variations in interface state density.

Crystallization of the amorphous semiconductor film may be performed by a combination of heat treatment and laser light irradiation, or by independently performing heat treatment or laser light irradiation plural times.

In this embodiment mode, a crystalline semiconductor film is formed by forming an amorphous semiconductor film over the base film 101*b* and crystallizing the amorphous semiconductor film. For the amorphous semiconductor film, amorphous silicon formed from a reaction gas of $SiH_4$ and $H_2$ is used. In this embodiment mode, the base film 101*a*, the base film 101*b*, and the amorphous semiconductor film are formed continuously in the same chamber at the same temperature of 330° C. while keeping a vacuum with reactive gases changed. Next, the amorphous semiconductor film is irradiated with laser light, specifically, a fundamental wave emitted from a laser oscillator with a repetition rate of 10 MHz or more, thereby forming the crystalline semiconductor film. A peak output of the laser light at this time is assumed to be in the range of 1 $GW/cm^2$ to 1 $TW/cm^2$. A cross-sectional view at this stage is shown in FIG. 5A.

The crystalline semiconductor film obtained as described above may be doped with a slight amount of an impurity element (boron or phosphorus) to control a threshold voltage of the thin film transistor. This doping with an impurity element may be performed to the amorphous semiconductor film before the crystallization step. When the amorphous semiconductor film is doped with an impurity element, activation of the impurity element can be performed by subsequent heat treatment for crystallization. In addition, defects and the like caused by doping can be improved.

Next, the crystalline semiconductor film 102 is selectively etched using a mask. In this embodiment mode, after removing an oxide film formed on the crystalline semiconductor film 102, another oxide film is formed. Then, a photomask is formed, and a semiconductor layer 103, a semiconductor layer 104, a semiconductor layer 105, and a semiconductor layer 106 are formed by a patterning process using a photolithography method.

Subsequently, the oxide film on the semiconductor layer is removed, and a gate insulating layer 107 is formed to cover the semiconductor layer 103, the semiconductor layer 104, the semiconductor layer 105, and the semiconductor layer 106.

The gate insulating layer 107 is formed using an insulating film containing silicon with a thickness of 10 nm to 150 nm by a plasma CVD method, a sputtering method, or the like. The gate insulating layer 107 may be formed of a known material such as an oxide material or nitride material of silicon typified by silicon nitride, silicon oxide, silicon oxynitride, or silicon nitride oxide, and it may have either a single-layer structure or a stacked structure. In this embodiment mode, the gate insulating layer is formed to have a three-layer structure of a silicon nitride film, a silicon oxide film, and a silicon nitride film. Alternatively, a single layer of a silicon oxynitride film or a stacked layer of two layers may be used. Preferably, a silicon nitride film having dense film quality is used. Furthermore, a thin silicon oxide film with a thickness of 1 nm to 100 nm, preferably, 1 nm to 10 nm, more preferably, 2 nm to 5 nm may be formed between the semiconductor layer and the gate insulating layer. The thin silicon oxide film can be formed by oxidizing the surface of a semiconductor region using a GRTA method, an LRTA method, or the like to form a thermal oxidation film.

Next, a first conductive film 108 with a thickness of 20 nm to 100 nm and a second conductive film 109 with a thickness of 100 nm to 400 nm, which are used as a gate electrode layer, are stacked over the gate insulating layer 107 (see FIG. 5B).

The first conductive film 108 and the second conductive film 109 can be formed by a known method such as a sputtering method, an evaporation method, a CVD method, or the like. Each of the first conductive film 108 and the second conductive film 109 may be formed using an element selected from tantalum (Ta), tungsten (W), titanium (Ti), molybdenum (Mo), aluminum (Al), copper, (Cu), chromium (Cr), and neodymium (Nd), or an alloy material or compound material containing the above element as its main component. In addition, a semiconductor film typified by a polycrystalline silicon film doped with an impurity element such as phosphorus, or an AgPdCu alloy may be used for the first conductive film 108 and the second conductive film 109. In addition, the gate electrode layer is not limited to the two-layer structure and it may have a three-layer structure in which a tungsten film with a thickness of 50 nm as a first conductive film, an alloy film of aluminum and silicon (Al—Si) with a thickness of 500 nm as a second conductive film, and a titanium nitride film with a thickness of 30 nm as a third conductive film are sequentially stacked. In the case of the three-layer structure, tungsten nitride may be used in place of tungsten of the first conductive film, an alloy film of aluminum and titanium (Al—Ti) may be used in place of the alloy film of aluminum and silicon (Al—Si) of the second conductive film, and a titanium film may be used in place of the titanium nitride film of the third conductive film. Alternatively, the gate electrode layer may be a single-layer structure. In this embodiment mode, a tantalum nitride (TaN) film is formed as the first conductive film 108 with a thickness of 30 nm, and a tungsten (W) film is formed as the second conductive film 109 with a thickness of 370 nm.

Next, a resist mask is formed using a photomask or a reticle provided with an auxiliary pattern having a light intensity reduction function made of a diffraction grating pattern or a semi-transmissive film, and the first conductive film 108 and the second conductive film 109 are selectively etched to form a first gate electrode layer, a conductive layer, and a second gate electrode layer so as to have a tapered shape. The resist mask includes a thick portion and a thin portion, and is formed so that a portion in which a channel formation region is to be formed is overlapped with the thick portion of the resist mask. After an electrode or a wire with a cross-sectional shape which spreads toward the bottom is obtained, the resist mask is removed.

Through the above steps, a gate electrode layer 117 including a first gate electrode layer 121 and a second gate electrode layer 131, and a gate electrode layer 118 including a first gate electrode layer 122 and a second gate electrode layer 132 can be formed in a peripheral driver circuit region 204; a gate electrode layer 127 including a first gate electrode layer 124 and a second gate electrode layer 134, a gate electrode layer 128 including a first gate electrode layer 125 and a second gate electrode layer 135, and a gate electrode layer 129 including a first gate electrode layer 126 and a second gate electrode layer 136 can be formed in a pixel region 206; and a conductive layer 130 including a conductive layer 123 and a conductive layer 133 can be formed in a connection region 205 (see FIG. 5C). Although the gate electrode layers are formed by dry etching in this embodiment mode, wet etching may be employed.

Note that through the etching step in forming the gate electrode layers, the gate insulating layer 107 may be etched to a certain extent and the thickness thereof may be decreased (so-called film reduction).

Subsequently, an impurity element 151 which imparts n-type conductivity is added using the gate electrode layer 117, the gate electrode layer 118, the gate electrode layer 127, the gate electrode layer 128, the gate electrode layer 129, and the conductive layer 130 as masks to form a first n-type impurity region 140a, a first n-type impurity region 140b, a first n-type impurity region 141a, a first n-type impurity region 141b, a first n-type impurity region 142a, a first n-type impurity region 142b, a first n-type impurity region 142c, a first n-type impurity region 143a, and a first n-type impurity region 143b (see FIG. 6A). Here, with the use of phosphine ($PH_3$) as a doping gas including an impurity element, the impurity element which imparts n-type conductivity is added so as to be contained in the first n-type impurity region 140a, the first n-type impurity region 140b, the first n-type impurity region 141a, the first n-type impurity region 141b, the first n-type impurity region 142a, the first n-type impurity region 142b, the first n-type impurity region 142c, the first n-type impurity region 143a, and the first n-type impurity region 143b at a concentration of approximately $1\times10^{17}/cm^3$ to $5\times10^{18}/cm^3$.

Next, a mask 153a, a mask 153b, a mask 153c, and a mask 153d are formed to cover the semiconductor layer 103, a part of the semiconductor layer 105, and the semiconductor layer 106. An impurity element 152 which imparts n-type conductivity is added using the mask 153a, the mask 153b, the mask 153c, the mask 153d, and the second gate electrode layer 132 as masks to form a second n-type impurity region 144a, a second n-type impurity region 144b, a third n-type impurity region 145a, a third n-type impurity region 145b, a second n-type impurity region 147a, a second n-type impurity region 147b, a second n-type impurity region 147c, a third n-type impurity region 148a, a third n-type impurity region 148b, a third n-type impurity region 148c, and a third n-type impurity region 148d (see FIG. 6B). Here, the impurity element which imparts n-type conductivity is added so as to be contained in the second n-type impurity region 144a and the second n-type impurity region 144b at a concentration of approximately $5\times10^{19}/cm^3$ to $5\times10^{20}/cm^3$. The third n-type impurity region 145a and the third n-type impurity region 145b are formed to contain the impurity element which imparts n-type conductivity at the same concentration as or at a slightly higher concentration than the third n-type impurity region 148a, the third n-type impurity region 148b, the third n-type impurity region 148c, and the third n-type impurity region 148d. In addition, a channel formation region 146 is formed in the semiconductor layer 104, and a channel formation region 149a and a channel formation region 149b are formed in the semiconductor layer 105.

Each of the second n-type impurity region 144a, the second n-type impurity region 144b, the second n-type impurity region 147a, the second n-type impurity region 147b, and the second n-type impurity region 147c is a high-concentration n-type impurity region and functions as a source or a drain. On the other hand, each of the third n-type impurity region 145a, the third n-type impurity region 145b, the third n-type impurity region 148a, the third n-type impurity region 148b, the third n-type impurity region 148c, and the third n-type impurity region 148d is a low-concentration impurity region and functions as an LDD (Lightly Doped Drain) region. Each of the n-type impurity region 145a and the n-type impurity region 145b is an Lov region because it is covered with the first gate electrode layer 122 with the gate insulating layer 107 interposed therebetween, and can relieve an electric field in the vicinity of a drain and suppress degradation of on-state current due to hot carriers. As a result, a thin film transistor which can operate at high speed can be formed. On the other hand, since each of the third n-type impurity region 148a, the third n-type impurity region 148b, the third n-type impurity region 148c, and the third n-type impurity region 148d is formed in an Loff region which is not covered with the gate electrode layer 127 or the gate electrode layer 128, it has the effect of reducing off-state current as well as relieving an electric field in the vicinity of a drain and preventing deterioration due to hot carrier injection. As a result, a semiconductor device which has high reliability and consumes less power can be manufactured.

Note that in this embodiment mode, a region where the impurity region is overlapped with the gate electrode layer with the gate insulating layer interposed therebetween is referred to as the Lov region, and a region where the impurity region is not overlapped with the gate electrode layer with the gate insulating layer interposed therebetween is referred to as the Loff region.

Next, the mask 153a, the mask 153b, the mask 153c, and the mask 153d are removed, and a mask 155a and a mask 155b are formed to cover the semiconductor layer 104 and the semiconductor layer 105. An impurity element 154 which imparts p-type conductivity is added using the mask 155a, the mask 155b, the gate electrode layer 117, and the gate electrode layer 129 as masks to form a first p-type impurity region 160a, a first p-type impurity region 160b, a first p-type impurity region 163a, a first p-type impurity region 163b, a second p-type impurity region 161a, a second p-type impurity region 161b, a second p-type impurity region 164a, and a second p-type impurity region 164b (see FIG. 6C). In this embodiment mode, boron (B) is used as the impurity element. Here, the impurity element which imparts p-type conductivity is added so as to be contained in the first p-type impurity region 160a, the first p-type impurity region 160b, the first p-type impurity region 163a, the first p-type impurity region 163b, the second p-type impurity region 161a, the second p-type impurity region 161b, the second p-type impurity region 164a, and the second p-type impurity region 164b at a concentration of approximately $1\times10^{20}/cm^3$ to $5\times10^{21}/cm^3$. In this embodiment mode, the second p-type impurity region 161a, the second p-type impurity region 161b, the second p-type impurity region 164a, and the second p-type impurity region 164b reflect the shapes of the gate electrode layer 117 and the gate electrode layer 129, and are formed in a self-aligned manner so as to have a lower concentration than that of the first p-type impurity region 160a, the first p-type impurity region 160b, the first p-type impurity region 163a, and the first p-type impurity region 163b. In addition, a channel formation region 162 and a channel formation region 165 are formed in the semiconductor layer 103 and the semiconductor layer 106, respectively.

Next, the mask 155a and the mask 155b are removed by $O_2$ ashing or a resist peeling solution, and an oxide film is also removed.

Next, heat treatment, intense light irradiation, or laser light irradiation is performed to activate the impurity element. This can repair plasma damage to the gate insulating layer and the interface between the gate insulating layer and the semiconductor layer at the same time as activation.

Figure 7A:
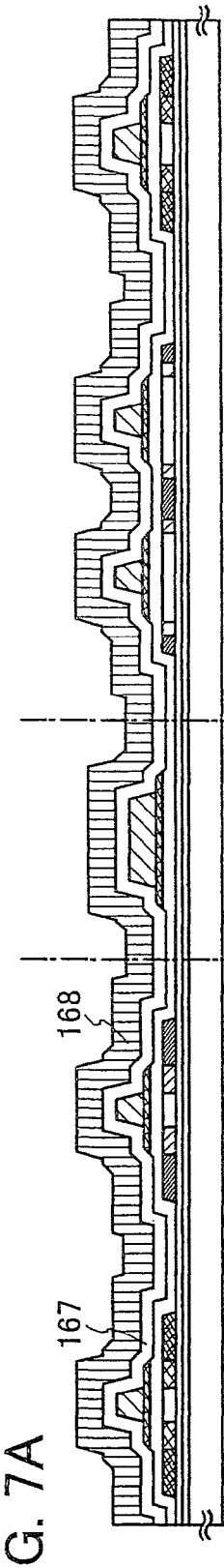
FIGS. 7A and 7B are diagrams showing a manufacturing process for a light emitting device.

Subsequently, an interlayer insulating layer is formed to cover the gate electrode layers and the gate insulating layer. In this embodiment mode, the interlayer insulating layer is formed to have a stacked structure of an insulating film 167 and an insulating film 168 (see FIG. 7A). The stacked structure is formed by forming a silicon nitride oxide film with a thickness of 200 nm as the insulating film 167 and forming a silicon oxynitride film with a thickness of 800 nm as the insulating film 168. Alternatively, the interlayer insulating layer may be formed to have a three-layer structure by forming a silicon oxynitride film with a thickness of 30 nm, forming a silicon nitride oxide film with a thickness of 140 nm, forming a silicon oxynitride film with a thickness of 800 nm to cover the gate electrode layers and the gate insulating layer. In this embodiment mode, the insulating film 167 and the insulating film 168 are continuously formed using a plasma CVD method in a similar manner to the base film. The insulating film 167 and the insulating film 168 are not limited to a silicon nitride film, and may be a silicon nitride oxide film, a silicon oxynitride film, or a silicon oxide film, or another insulating film containing silicon used as a single layer or a stacked structure of three or more layers.

Next, heat treatment is performed in a nitrogen atmosphere at 300° C. to 550° C. for 1 to 12 hours to hydrogenate the semiconductor layer. Preferably, it is performed at 400° C. to 500° C. This step is a step of terminating dangling bonds of the semiconductor layer with hydrogen contained in the insulating film 167 that is the interlayer insulating layer. In this embodiment mode, heat treatment is performed at 410° C.

Next, contact holes (openings) are formed in the insulating film 167, the insulating film 168, and the gate insulating layer 107 using a mask made of a resist so as to reach the semiconductor layers. Etching may be performed once or a plurality of times depending on a selection ratio of a material to be used.

Next, a conductive film is formed to cover the openings, and the conductive film is etched to form a source or drain electrode layer 169a, a source or drain electrode layer 169b, a source or drain electrode layer 170a, a source or drain electrode layer 170b, a source or drain electrode layer 171a, a source or drain electrode layer 171b, a source or drain electrode layer 172a, a source or drain electrode layer 172b, and a wire layer 156 each of which is electrically connected to a part of the source region or the drain region. The source or drain electrode layer can be formed by forming a conductive film by a PVD method, a CVD method, an evaporation method, or the like and etching the conductive film into a desired shape. In addition, a conductive layer can be selectively formed in a predetermined position by a droplet discharge method, a printing method, an electrolytic plating method, or the like. Furthermore, a reflow method or a damascene method may be used. The source or drain electrode layer is formed using metal such as Ag, Au, Cu, Ni, Pt, Pd, Ir, Rh, W, Al, Ta, Mo, Cd, Zn, Fe, Ti, Zr, or Ba or an alloy or metal nitride thereof. In addition, a conductive material including Si or Ge may be used. In addition, it may have a stacked structure thereof. In this embodiment mode, a titanium (Ti) film is formed with a thickness of 100 nm, an alloy film of aluminum and silicon (Al—Si) is formed with a thickness of 700 nm, and a titanium (Ti) film is formed with a thickness of 200 nm, which are selectively etched into a desired shape.

Figure 7B:
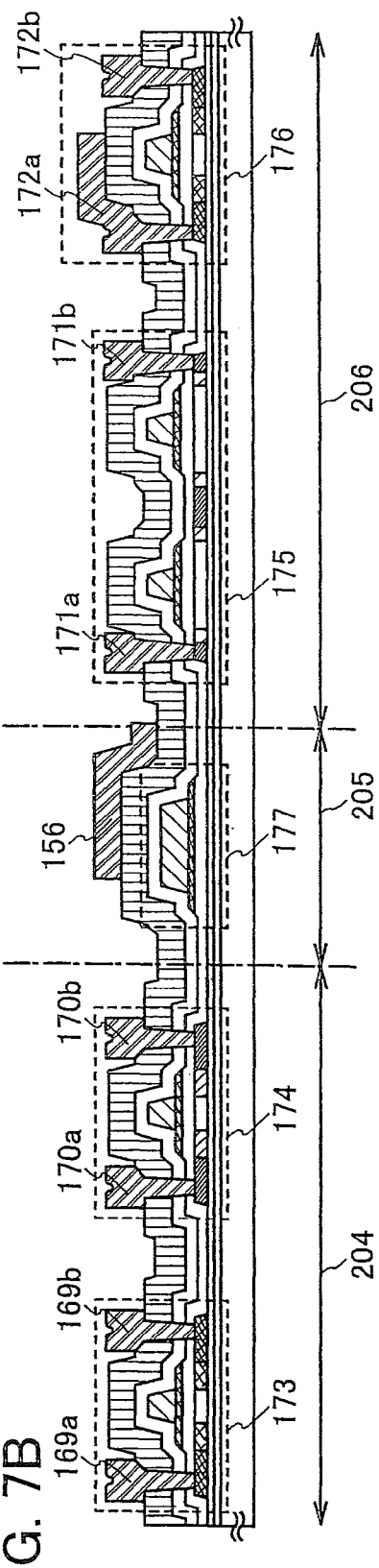

Through the above steps, an active matrix substrate can be manufactured which includes a p-channel thin film transistor 173 having a p-type impurity region in the Lov region and an n-channel thin film transistor 174 having an n-type impurity region in the Lov region in the peripheral driver circuit region 204, a conductive layer 177 in the connection region, and a multi-channel n-channel thin film transistor 175 having an n-type impurity region in a Loff region and a p-channel thin film transistor 176 having a p-type impurity region in a Lov region in the pixel region 206 (see FIG. 7B).

Next, an insulating film 180 and an insulating film 181 are formed as a second interlayer insulating layer (see FIG. 8A). FIGS. 8A to 8C show a manufacturing process for a display device, in which a reference numeral 201 denotes a separation region for separation by scribing; 202, an external terminal connection region which is an attachment portion of an FPC; 203, a wire region which is a lead wire region of a peripheral portion; 204, a peripheral driver circuit region; 205, a connection region; and 206, a pixel region. In the wire region 203, a wire 179a and a wire 179b are provided, and in the external terminal connection region 202, a terminal electrode layer 178 connected to an external terminal is provided.

The insulating film 180 and the insulating film 181 can be formed of a material selected from substances including an inorganic insulating material such as silicon oxide, silicon nitride, silicon oxynitride, silicon nitride oxide, aluminum nitride (AlN), aluminum oxynitride (AlON), aluminum nitride oxide (AlNO) having a higher content of nitrogen than that of oxygen, aluminum oxide, diamond-like carbon (DLC), a nitrogen-containing carbon film (CN), PSG (phosphosilicate glass), BPSG (borophosphosilicate glass), an alumina film, and polysilazane. Alternatively, a siloxane resin may be used. Note that the siloxane resin corresponds to a resin having Si—O—Si bonds. Siloxane has a skeleton structure formed from a bond of silicon (Si) and oxygen (O). As a substituent, an organic group containing at least hydrogen (for example, an alkyl group or aromatic hydrocarbon) is used. A fluoro group may be used as the substituent. Alternatively, an organic group containing at least hydrogen and a fluoro group may be used as the substituent. Furthermore, an organic insulating material may be used; an organic material may be either photosensitive or non-photosensitive; and polyimide, acrylic, polyamide, polyimide amide, a resist, benzocyclobutene, or a low-dielectric constant organic insulating material can be used.

Subsequently, openings 182 and 183 are formed in the insulating film 180 and the insulating film 181 which are the second interlayer insulating layer as shown in FIG. 8B. In the connection region 205, the wire region 203, the external terminal connection region 202, the separation region 201, and the like, a large area of the insulating film 180 and the insulating film 181 needs to be etched. However, in the pixel region 206, an opening area is significantly smaller and more minute than that in the connection region 205 or the like. Therefore, a photolithography step for forming an opening in the pixel region and a photolithography step for forming an opening in the connection region are performed separately.

Then, a minute opening 184, that is, a contact hole is formed in the insulating film 180 and the insulating film 181 in the pixel region 206 as shown in FIG. 8C.

This embodiment mode explains the case of etching the insulating film 180 and the insulating film 181 using a mask which covers the connection region 205, the wire region 203, the external terminal connection region 202, the separation region 201, and the peripheral driver circuit region 204 and is provided with a predetermined opening in the pixel region 206. However, the present invention is not limited thereto. For example, since the opening in the connection region 205 has large area, the amount to be etched is large. Such a large-area opening may be formed by performing etching a plurality of times.

Figures 9A, 9B:
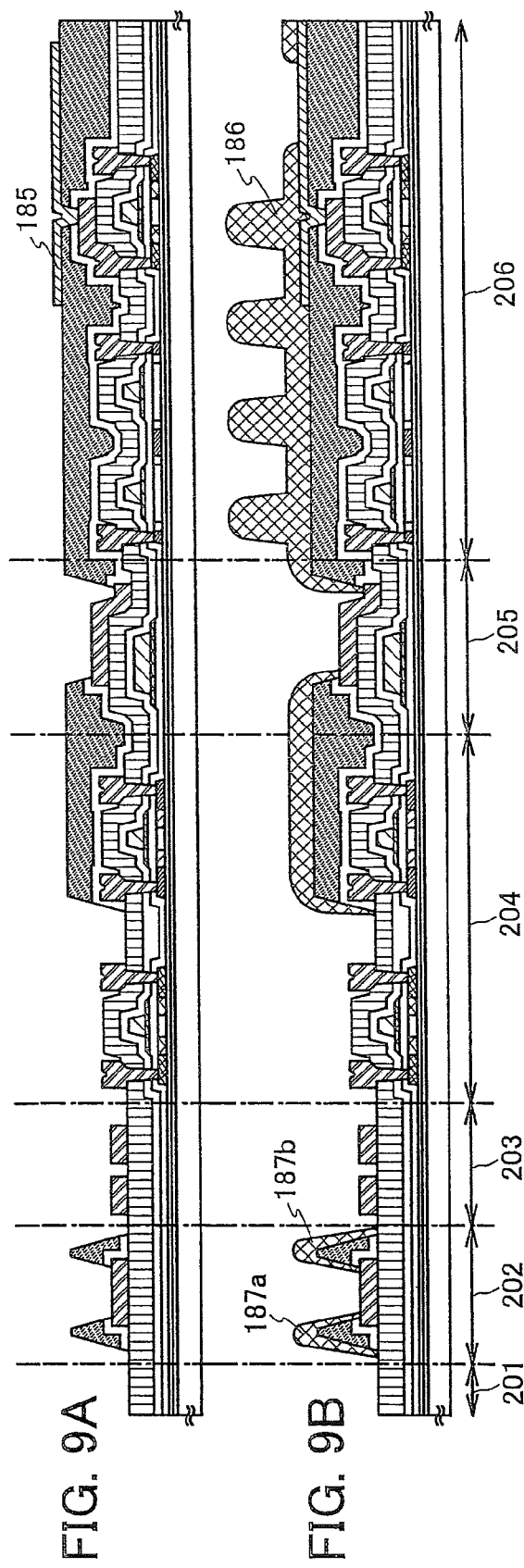
FIGS. 9A and 9B are diagrams showing a manufacturing process for a light emitting device.

Next, a first electrode layer 185 (also referred to as a pixel electrode layer) is formed to be in contact with the source or drain electrode layer 172a as shown in FIG. 9A. The first electrode layer functions as an anode or a cathode, and may be formed using a film containing as its main component an element selected from Ti, Ni, W, Cr, Pt, Zn, Sn, In, and Mo, TiN, $TiSi_xN_y$, $WSi_x$, $WN_x$, $WSi_xN_y$, NbN, or an alloy or compound material containing the above element as its main component or stacked films thereof with a total thickness of 100 nm to 800 nm.

In this embodiment mode, a structure in which a light emitting element is used as a display element and light emitted from the light emitting element is extracted from the first electrode layer 185 side is employed; therefore, the first electrode layer 185 has a light transmitting property. A transparent conductive film is formed and etched into a desired shape, thereby forming the first electrode layer 185. For the first electrode layer 185 used in the present invention, indium tin oxide containing silicon oxide (hereinafter referred to as "ITSO"), zinc oxide, tin oxide, indium oxide, or the like may be used. Alternatively, a transparent conductive film such as an alloy of indium oxide and zinc oxide in which indium oxide is mixed with zinc oxide (ZnO) of 2 wt % to 20 wt % can be used. In addition to the transparent conductive film, a titanium nitride film or a titanium film may be used for the first electrode layer 185. In this case, after forming the transparent conductive film, a titanium nitride film or a titanium film is formed with such a thickness as to transmit light (preferably, approximately 5 inn to 30 nm). In this embodiment mode, ITSO using indium tin oxide and silicon oxide is used for the first electrode layer 185.

Figure 11:
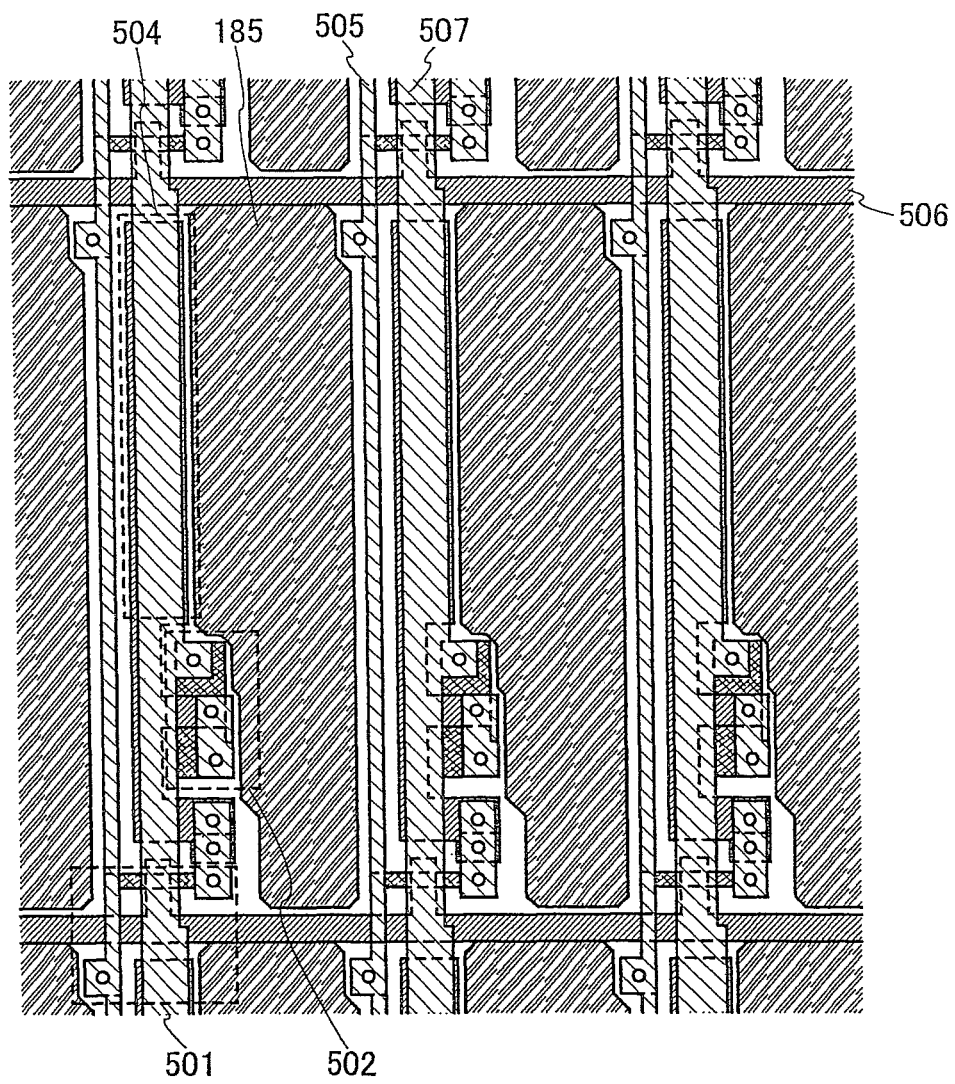
FIG. 11 is an example of a top view of a pixel region.

FIG. 11 shows an example of a top view of the pixel region at the stage where the first electrode layer 185 is formed. In FIG. 11, one pixel includes a TFT 501, a TFT 502, a capacitor element 504, a first electrode layer 185, a gate wire layer 506, a source and drain wire layer 505, and a power supply line 507.

Next, heat treatment may be performed after forming the first electrode layer 185. Through this heat treatment, moisture included in the first electrode layer 185 is released. Therefore, degasification or the like is not caused in the first electrode layer 185. Even when a light emitting material which is easily deteriorated by moisture is formed over the first electrode layer, the light emitting material is not deteriorated; thus, a highly reliable display device can be manufactured. Since ITSO is used for the first electrode layer 185 in this embodiment mode, it remains amorphous even when baked unlike ITO (alloy of indium oxide and zinc oxide) which is crystallized when baked. Accordingly, ITSO has higher planarity than ITO and short-circuit with a cathode is not easily generated even when the layer containing an organic compound is thin.

Subsequently, a partition 186 made of an insulating material is formed to cover an end portion of the first electrode layer 185 and the source or drain electrode layer (see FIG. 9B). The partition 186 is formed using a photomask or a reticle provided with an auxiliary pattern having a light reduction function made of a diffraction grating pattern or a semi-transmissive film. In addition, the partition 186 has a cross-sectional shape including a plurality of thick portions and has a step on its side. This partition 186 can be obtained by a manufacturing method according to Embodiment Mode 1.

In order to perform a full color display, electroluminescent layers for emitting light of RGB need to be formed separately when forming an electroluminescent layer over the first electrode layer. Therefore, when forming electroluminescent layers of the other colors, the pixel electrode layer (first electrode layer) is covered with an evaporation mask. The evaporation mask may be a film formed of a metal material or the like. At this time, the evaporation mask is provided over the partition 186 and supported with the thick portions of the partition 186. By providing the partition 186 with the thick portion, a defective shape of the first electrode layer due to a mask can be prevented, which leads to manufacturing of a display device with high reliability and high image quality without the first electrode layer causing defective light emission and defective display.

In addition, an insulator (insulating layer) 187a and an insulator (insulating layer) 187b are formed in the external terminal connection region 202 in the same step as the partition 186.

In the connection region 205, the partition 186 is formed to cover end portions of the insulating film 180 and the insulating film 181 facing the opening 182. Since the end portions of the insulating film 180 and the insulating film 181 are processed to have steep steps by selective etching, coverage of a second electrode layer 189 to be stacked thereover is poor. Therefore, as in the present invention, steps around the openings are covered with the partition 186 to smooth the steps, thereby improving the coverage of the second electrode layer 189 to be stacked. In the connection region 205, a wire layer formed of the same material and in the same step as the second electrode layer is electrically connected to the wire layer 156. Although the second electrode layer 189 is in contact with and electrically connected to the wire layer 156 in this embodiment mode, it may be electrically connected through another wire.

Figure 10:
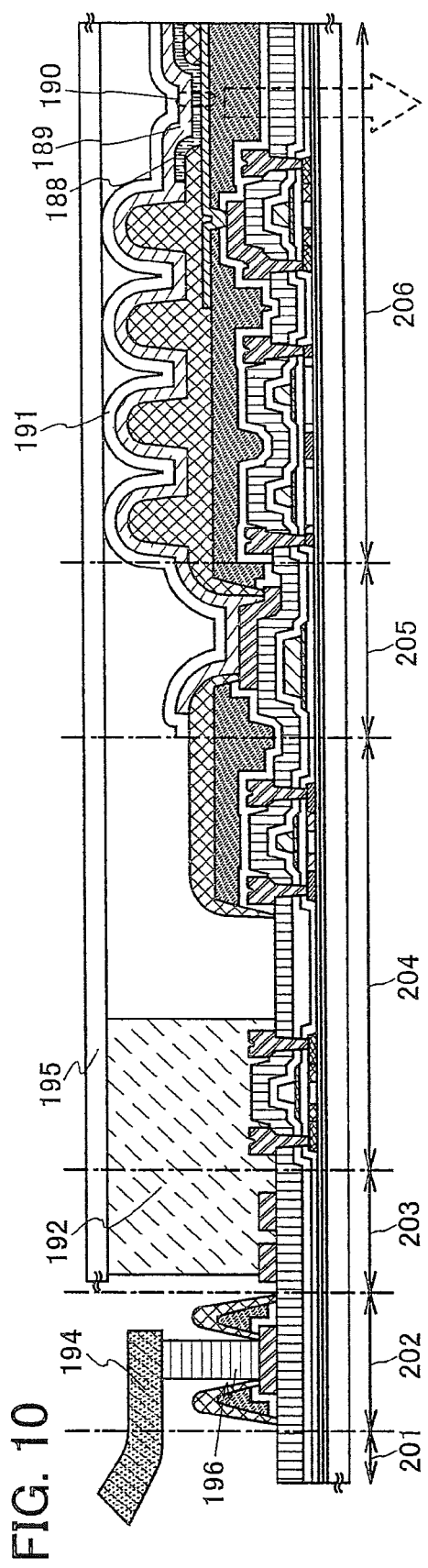
FIG. 10 is a diagram showing a structure of an active matrix light emitting device.

Next, an electroluminescent layer 188 is formed over the first electrode layer 185. Note that, although FIG. 10 shows only one pixel, respective electroluminescent layers corresponding to colors of R (red), G (green), and B (blue) are separately formed in this embodiment mode. In this embodiment mode, for the electroluminescent layer 188, each material emitting light of R (red), G (green), or B (blue) is selectively formed by an evaporation method using an evaporation mask.

Next, the second electrode layer 189 made of a conductive film is formed over the electroluminescent layer 188. For the second electrode layer 189, a material having a low work function (Al, Ag, Li, Ca, an alloy or a compound thereof, MgAg, MgIn, AlLi, $CaF_2$, or calcium nitride) may be used. Thus, a light emitting element 190 including the first electrode layer 185, the electroluminescent layer 188, and the second electrode layer 189 is formed.

In the display device of this embodiment mode shown in FIG. 10, light emitted from the light emitting element 190 is extracted from the first electrode layer 185 side to a direction indicated by an arrow in FIG. 10.

It is effective to provide a passivation film 191 so as to cover the second electrode layer 189. As the passivation film 191, a single layer or a stacked layer of an insulating film formed of silicon nitride, silicon oxide, silicon oxynitride (SiON), silicon nitride oxide (SiNO), aluminum nitride (AlN), aluminum oxynitride (AlON), aluminum nitride oxide (AlNO) having a higher content of nitrogen than that of oxygen, diamond-like carbon (DLC), or a nitrogen-containing carbon film (CN) can be used. Alternatively, a siloxane resin material may be used.

Subsequently, the light emitting element is sealed by fixing the substrate 100 over which the light emitting element 190 is formed and a sealing substrate 195 with a sealant 192 (see FIG. 10).

Note that a region surrounded by the sealant may be filled with a filler or an adhesive tape, and nitrogen may be contained by sealing the region in a nitrogen atmosphere. Since bottom emission is employed in this embodiment mode, the filler does not need to have a light transmitting property. However, in the case of employing a structure in which light is transmitted and extracted through the filler, the filler needs to have a light transmitting property. Typically, a visible light curing, ultraviolet curing, or thermosetting epoxy resin may be used. Through the above steps, a display device having a display function with the use of a light emitting element in this embodiment mode is completed. Alternatively, the filler can be dropped in a liquid state and encapsulated in the display device.

In addition, a desiccant may be provided in a panel to prevent deterioration of the light emitting element by moisture.

Next, in the external terminal connection region 202, an FPC 194 is connected to the terminal electrode layer 178 with an anisotropic conductive layer 196 and electrically connected to the outside.

In the display device of the present invention, a driving method for image display is not particularly limited, and for example, a dot sequential driving method, a line sequential driving method, an area sequential driving method, or the like may be used. Typically, the line sequential driving method is used, and a time division gray scale driving method or an area gray scale driving method may be appropriately used. Further, a video signal inputted to the source line of the display device may be either an analog signal or a digital signal. The driver circuit and the like may be appropriately designed in accordance with the video signal.

Furthermore, in a display device using a digital video signal, a video signal inputted to a pixel is classified into a video signal at a constant voltage (CV) and a video signal at a constant current (CC). The video signal at a constant voltage (CV) is further classified into a video signal with a constant voltage applied to a light emitting element (CVCV) and a video signal with a constant current applied to a light emitting element (CVCC). In addition, the video signal at a constant current (CC) is classified into a video signal with a constant voltage applied to a light emitting element (CCCV) and a video signal with a constant current applied to a light emitting element (CCCC).

By using the present invention, a highly reliable display device can be manufactured through a simplified process. Therefore, a display device with high definition and high image quality can be manufactured at low cost with high yield.

This embodiment mode can be freely combined with any one of Embodiment Modes 1 to 3.

Embodiment Mode 5

A television device can be completed by using the light emitting device formed in accordance with the present invention. As for the display panel, there are a case in which only a pixel portion is formed and a scan line driver circuit and a signal line driver circuit are mounted by a TAB method; a case in which a scan line driver circuit and a signal line driver circuit are mounted by a COG method; a case in which a TFT is formed, a pixel portion and a scan line driver circuit are formed over a substrate, and a signal line driver circuit is separately mounted as a driver IC; a case in which a pixel portion, a signal line driver circuit, and a scan line driver circuit are integrated with a substrate; and the like. The display panel may have any structure.

As another external circuit, a video signal amplifier circuit which amplifies a video signal among signals received by a tuner, a video signal processing circuit which converts the signals outputted from the video signal amplifier circuit into color signals corresponding to respective colors of red, green, and blue, a control circuit which converts the video signal into an input specification of the driver IC, and the like are provided on an input side of the video signal. The control circuit outputs signals to both a scan line side and a signal line side. In the case of digital driving, a signal dividing circuit may be provided on the signal line side and an input digital signal may be divided into m pieces and supplied.

An audio signal among the signals received by the tuner is sent to an audio signal amplifier circuit and an output thereof is supplied to a speaker through an audio signal processing circuit. A control circuit receives control information of a receiving station (reception frequency) or sound volume from an input portion and transmits signals to the tuner and the audio signal processing circuit.

Figure 12A:
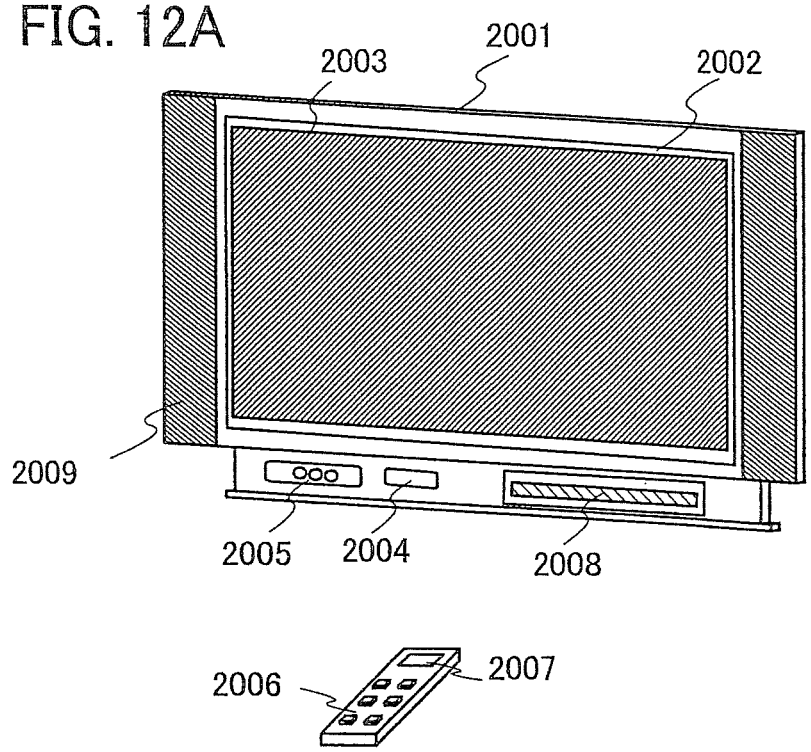
FIGS. 12A and 12B are diagrams showing electronic devices to which the present invention is applied.
Figure 12B:
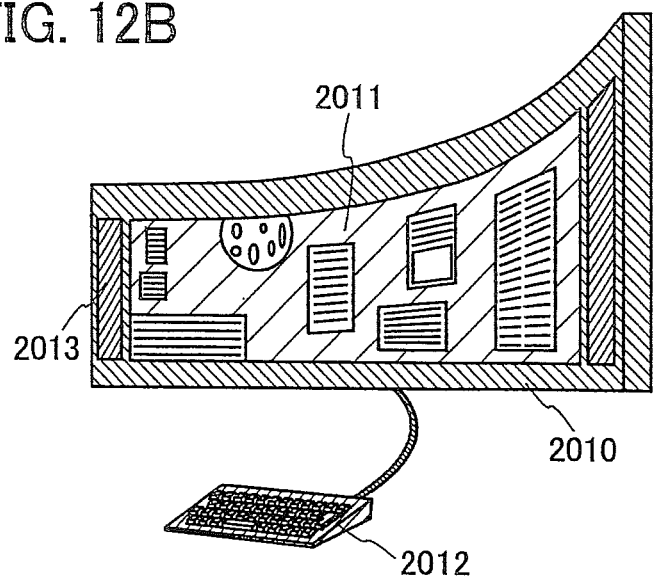

A television device can be completed by incorporating a display module into a chassis as shown in FIGS. 12A and 12B. A display panel provided with components up to an FPC is also referred to as a display module. A main screen 2003 is formed by using the display module, and a speaker portion 2009, an operation switch, and the like are provided as its accessory equipment. Thus, a television device can be completed in accordance with the present invention.

In addition, reflected light of light entering from outside may be blocked by using a retardation film or a polarizing plate. In the case of a top emission display device, an insulating layer serving as a partition may be colored and used as a black matrix. This partition can be formed by a droplet discharge method or the like. Carbon black or the like may be mixed into a black resin of a pigment material or a resin material such as polyimide, and a lamination thereof may also be used. By a droplet discharge method, different materials may be discharged plural times to the same region to form the partition. A quarter wave plate and a half wave plate may be used as the retardation films and may be designed to be able to control light. As the structure, a TFT element substrate, the light emitting element, a sealing substrate (sealant), a retardation film (quarter wave plate), a retardation film (half wave plate), and a polarizing plate are sequentially stacked, in which light emitted from the light emitting element is transmitted therethrough and emitted outside from the polarizing plate side. The retardation films or polarizing plate may be provided on a side where light is emitted or may be provided on both sides in the case of a dual emission display device in which light is emitted from the both surfaces. In addition, an anti-reflection film may be provided outside the polarizing plate. Accordingly, a higher-definition and more precise image can be displayed.

As shown in FIG. 12A, a display panel 2002 using a display element is incorporated in a chassis 2001, and general TV broadcast can be received by a receiver 2005. When the display device is connected to a communication network by wired or wireless connections via a modem 2004, one-way (from a sender to a receiver) or two-way (between a sender and a receiver or between receivers) information communication can be performed. The television device can be operated by using a switch built in the chassis 2001 or a remote control unit 2006. This remote control unit 2006 may also be provided with a display portion 2007 for displaying output information.

Further, the television device may also include a sub screen 2008 formed using a second display panel so as to display channels, volume, or the like, in addition to the main screen 2003. In this structure, the main screen 2003 may be formed using an EL display panel having a wide viewing angle, and the sub screen 2008 may be formed using a liquid crystal display panel capable of displaying images while consuming less power. In order to reduce the power consumption preferentially, the main screen 2003 may be formed using a liquid crystal display panel, and the sub screen may be formed using an EL display panel, which can be switched on and off. In accordance with the present invention, a highly reliable display device can be formed even when such a large-sized substrate is used and a large number of TFTs or electronic components are used.

FIG. 12B shows a television device having a large-sized display portion, for example, a 20-inch to 80-inch display portion. The television device includes a chassis 2010, a keyboard portion 2012 that is an operation portion, a display portion 2011, a speaker portion 2013, and the like. The present invention is applied to manufacturing of the display portion 2011. The display portion of FIG. 12B is formed using a material which can be curved; thus, the television device has a curved display portion. Since the shape of a display portion can be freely designed as described above, a television device having a desired shape can be manufactured.

Since the display device can be formed through a simplified process in accordance with the present invention, cost reduction can also be achieved. Therefore, the television device using the present invention can be formed at low cost even when formed to have a large-area display portion. Accordingly, a television device with high performance and high reliability can be manufactured with high yield.

Naturally, the present invention is not limited to the television device, and can be applied to various use applications as large-area display media such as an information display board at a train station, an airport, or the like, and an advertisement display board on the street, as well as a monitor of a personal computer.

This embodiment mode can be freely combined with any one of Embodiment Modes 1 to 4.

Embodiment Mode 6

This embodiment mode is explained with reference to FIGS. 13A and 13B. This embodiment mode describes an example of a module using a panel including the display device manufactured in Embodiment Modes 1 to 4.

Figure 13A:
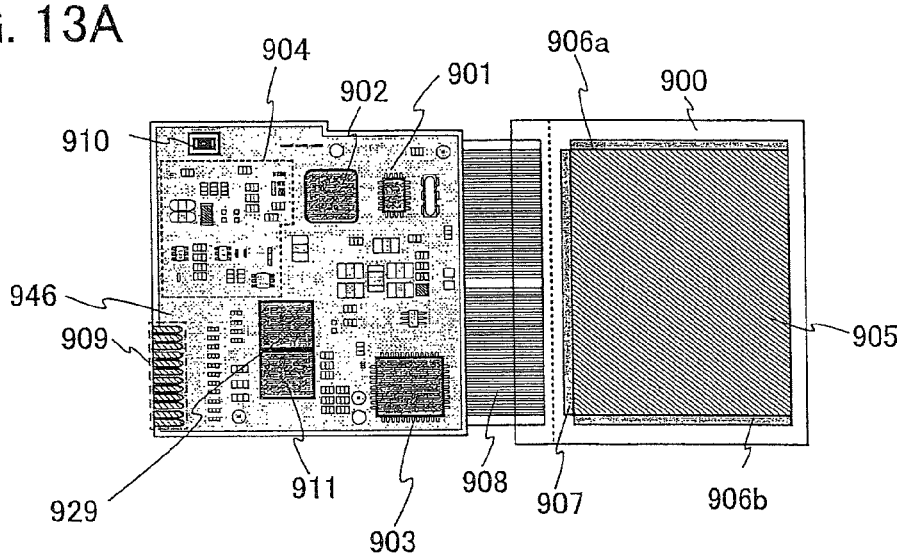
FIGS. 13A and 13B are diagrams showing an electronic device to which the present invention is applied.

A module of an information terminal shown in FIG. 13A includes a printed wiring board 946 over which a controller 901, a central processing unit (CPU) 902, a memory 911, a power source circuit 903, an audio processing circuit 929, a transmission/reception circuit 904, and other elements such as a resistor, a buffer, and a capacitor are mounted. In addition, a panel 900 is connected to the printed wiring board 946 through a flexible wiring circuit (FPC) 908.

The panel 900 is provided with a pixel portion 905 having a light emitting element in each pixel, a first scan line driver circuit 906a and a second scan line driver circuit 906b each of which selects a pixel included in the pixel portion 905, and a signal line driver circuit 907 which supplies a video signal to the selected pixel.

Various control signals are inputted and outputted through an interface (I/F) portion 909 provided over the printed wiring board 946. An antenna port 910 for transmitting and receiving signals to/from an antenna is provided over the printed wiring board 946.

Note that in this embodiment mode, the printed wiring board 946 is connected to the panel 900 through the FPC 908; however, the present invention is not limited to this structure. The controller 901, the audio processing circuit 929, the memory 911, the CPU 902, or the power source circuit 903 may be directly mounted on the panel 900 by a COG (Chip On Glass) method. Moreover, various elements such as a capacitor and a buffer provided on the printed wiring board 946 prevent a noise in a power source voltage or a signal and a slow rise of a signal.

Figure 13B:
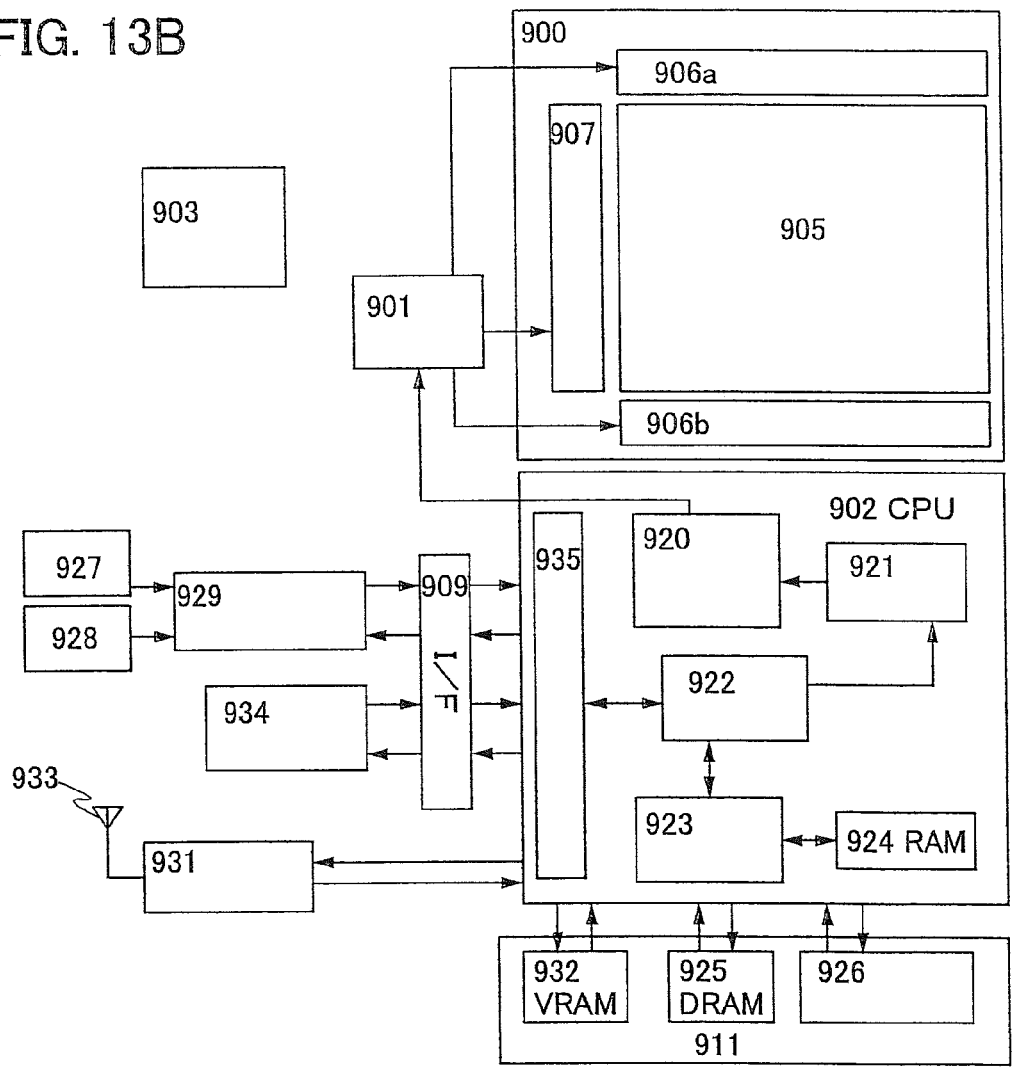

FIG. 13B is a block diagram of the module shown in FIG. 13A. A module 999 includes a VRAM 932, a DRAM 925, a flash memory 926, and the like as the memory 911. The VRAM 932 stores image data to be displayed by a panel, the DRAM 925 stores image data or audio data, and the flash memory stores various programs.

The power source circuit 903 generates a power source voltage applied to the panel 900, the controller 901, the CPU 902, the audio processing circuit 929, the memory 911, and the transmission/reception circuit 931. Moreover, depending on the specifications of the panel, a current source is provided in the power source circuit 903 in some cases.

The CPU 902 includes a control signal generating circuit 920, a decoder 921, a register 922, an arithmetic circuit 923, a RAM 924, an interface 935 for the CPU, and the like. Various signals inputted to the CPU 902 through the interface 935 are inputted to the arithmetic circuit 923, the decoder 921, and the like after being held in the register 922 once. The arithmetic circuit 923 operates based on the inputted signal and specifies an address to send various instructions. On the other hand, a signal inputted to the decoder 921 is decoded and inputted to the control signal generating circuit 920. The control signal generating circuit 920 generates a signal containing various instructions based on the inputted signal and sends it to the address specified by the arithmetic circuit 923, which are specifically the memory 911, the transmission/reception circuit 931, the audio processing circuit 929, the controller 901, and the like.

The memory 911, the transmission/reception circuit 931, the audio processing circuit 929, and the controller 901 operate in accordance with respective transmitted instructions. The operations are briefly explained below.

The signal inputted from an input unit 934 is transmitted to the CPU 902 mounted on the printed wiring board 946 through the interface 909. The control signal generating circuit 920 converts the image data stored in the VRAM 932 into a predetermined format in accordance with the signal transmitted from the input unit 934 such as a pointing device and a keyboard, and then transmits it to the controller 901.

The controller 901 processes a signal containing image data transmitted from the CPU 902 in accordance with the specifications of the panel and supplies it to the panel 900. The controller 901 generates and sends a Hsync signal, a Vsync signal, a clock signal CLK, an alternating voltage (AC Cont), and a switching signal L/R to the panel 900 based on the power source voltage inputted from the power source circuit 903 and various signals inputted from the CPU 902.

In the transmission/reception circuit 904, a signal transmitted and received as an electric wave by the antenna 933 is processed. In specific, high frequency circuits such as an isolator, a band path filter, a VCO (Voltage Controlled Oscillator), an LPF (Low Pass Filter), a coupler, and a balan are included. Among the signals transmitted and received by the transmission/reception circuit 904, a signal containing audio data is transmitted to an audio processing circuit 929 in accordance with an instruction transmitted from the CPU 902.

The signal containing audio data transmitted in accordance with the instruction from the CPU 902 is demodulated into an audio signal in the audio processing circuit 929 and transmitted to a speaker 928. The audio signal transmitted from a microphone 927 is modulated in the audio processing circuit 929 and transmitted to the transmission/reception circuit 904 in accordance with the instruction from the CPU 902.

The controller 901, the CPU 902, the power source circuit 903, the audio processing circuit 929, and the memory 911 can be incorporated as a package of this embodiment mode. This embodiment mode can be applied to any circuit besides high frequency circuits such as an isolator, a band path filter, a VCO (Voltage Controlled Oscillator), an LPF (Low Pass Filter), a coupler, and a balan.

The display panel 900 includes a spacer over the pixel electrode or an insulator covering the periphery of the pixel electrode. Accordingly, as for a module having this display panel 900, a mask used when forming an electroluminescent layer is supported so as not to be in contact with the pixel electrode. Thus, the pixel electrode can be prevented from being damaged, and effects such as high image quality and high reliability can be obtained.

Embodiment Mode 7

Figure 14:
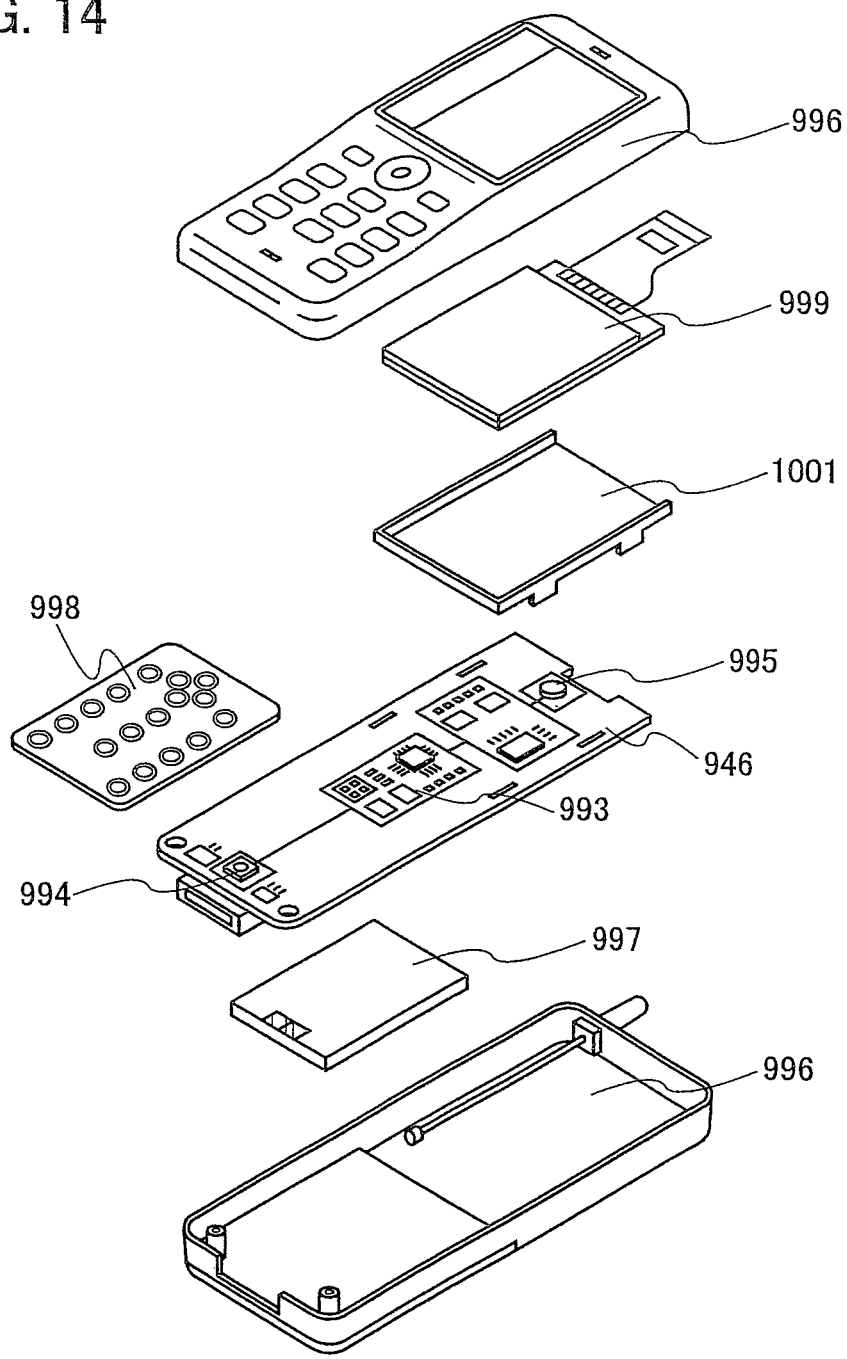
FIG. 14 is a diagram showing an electronic device to which the present invention is applied.

This embodiment mode is explained with reference to FIG. 14. FIG. 14 shows one aspect of a portable phone (mobile phone) including the module manufactured in Embodiment Mode 6, which operates wirelessly and can be carried. The display panel 900 is detachably incorporated in a housing 1001 so as to be easily fixed to a module 999. The housing 1001 can be appropriately changed in shape and size in accordance with an electronic device incorporated therein.

The housing 1001 in which the display panel 900 is fixed is fit in the printed wiring board 946 and assembled as a module. On the printed wiring board 946, a controller, a CPU, a memory, a power source circuit, and other elements such as a resistor; a buffer, and a capacitor are mounted. Moreover, an audio processing circuit including a microphone 994 and a speaker 995 and a signal processing circuit 993 such as a transmission/reception circuit are provided. The display panel 900 is connected to the printed wiring board 946 through the FPC 908.

The module 999, an input unit 998, and a battery 997 are stored in a chassis 996. The pixel portion of the display panel 900 is arranged so that it can be seen through a window formed in the chassis 996.

The display panel 900 includes a spacer over the pixel electrode or an insulator covering the periphery of the pixel electrode. Accordingly, as for the module having this display panel 900, a mask used when forming an electroluminescent layer is supported so as not to be in contact with the pixel electrode. Thus, the pixel electrode can be prevented from being damaged, and effects such as high image quality and high reliability can be obtained.

The chassis 996 shown in FIG. 14 shows an exterior shape of a portable phone as an example. However, the electronic device of this embodiment mode can be modified into various modes in accordance with functions and applications. In the following embodiment mode, examples of the modes are explained.

Embodiment Mode 8

Various display devices can be manufactured by applying the present invention. In other words, the present invention can be applied to various electronic devices into which the display devices are incorporated in the display portions.

Examples of such electronic devices are as follows: a camera such as a video camera or a digital camera, a projector, a head-mounted display (a goggle type display), a car navigation system, a car stereo, a personal computer, a game machine, a portable information terminal (such as a mobile computer, a portable phone, or an electronic book), an image reproduction device (specifically, a device which can reproduce a recording medium such as a digital versatile disc (DVD) and includes a display capable of displaying the image), and the like. Examples thereof are shown in FIGS. 15A to 15D.

Figure 15A:
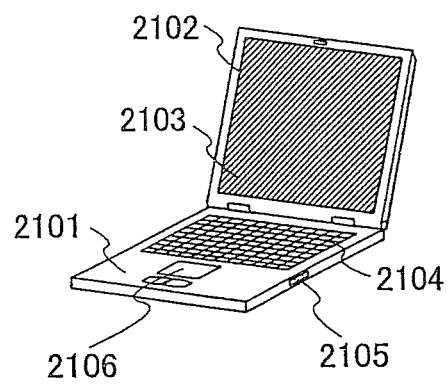
FIGS. 15A to 15D are diagrams showing electronic devices to which the present invention is applied.

FIG. 15A shows a computer, which includes a main body 2101, a chassis 2102, a display portion 2103, a keyboard 2104, an external connection port 2105, a pointing mouse 2106, and the like. By using the present invention, a computer which has high reliability and displays a high-quality image even when the size thereof is reduced and the pixel is miniaturized can be completed.

Figure 15B:
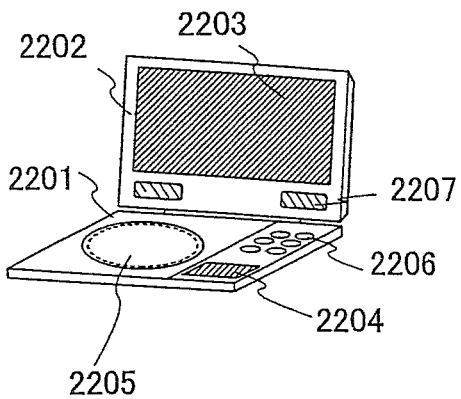

FIG. 15B shows an image reproduction device having a recording medium (specifically, a DVD reproduction device), which includes a main body 2201, a chassis 2202, a display portion A 2203, a display portion B 2204, a recording medium (such as DVD) reading portion 2205, an operation key 2206, a speaker portion 2207, and the like. The display portion A 2203 mainly displays image information, and the display portion B 2204 mainly displays character information. By using the present invention, an image reproduction device which has high reliability and displays a high-quality image even when the size thereof is reduced and the pixel is miniaturized can be completed.

Figure 15C:
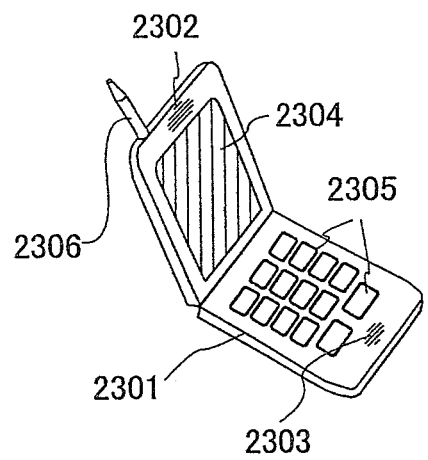

FIG. 15C shows a portable phone, which includes a main body 2301, an audio output portion 2302, an audio input portion 2303, a display portion 2304, an operation switch 2305, an antenna 2306, and the like. By using the present invention, a portable phone which has high reliability and displays a high-quality image even when the size thereof is reduced and the pixel is miniaturized can be completed.

Figure 15D:
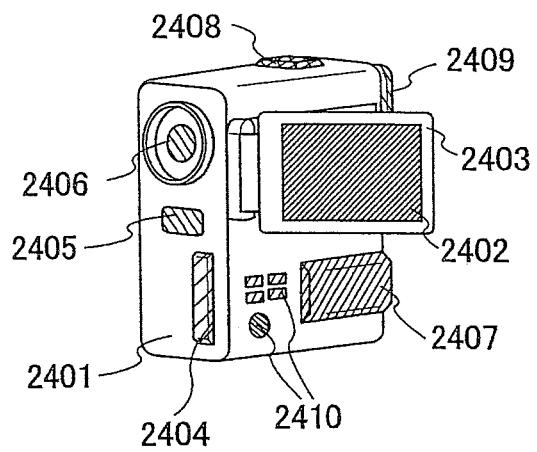

FIG. 15D shows a video camera, which includes a main body 2401, a display portion 2402, a chassis 2403, an external connection port 2404, a remote control receiving portion 2405, an image receiving portion 2406, a battery 2407, an audio input portion 2408, an eye piece portion 2409, an operation key 2410, and the like. By using the present invention, a video camera which has high reliability and displays a high-quality image even when the size thereof is reduced and the pixel is miniaturized can be completed.

This embodiment mode can be freely combined with any one of Embodiment Modes 1 to 4.

Embodiment Mode 9

Figure 16:
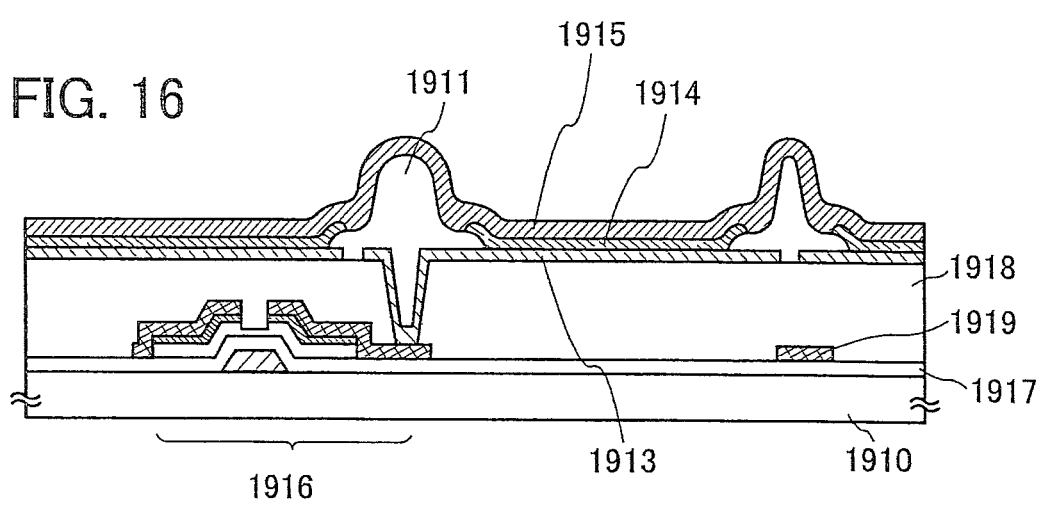
FIG. 16 is a diagram showing an example of a cross-sectional structure of the present invention.

Here, FIG. 16 shows a TFT using amorphous silicon for an active layer as an example of a TFT electrically connected to a light emitting element.

In FIG. 16, a reference numeral 1910 denotes a substrate; 1911, a partition; 1913, a first electrode; 1914, a layer containing an organic compound; 1915, a second electrode; 1916, an amorphous silicon TFT; 1917, a gate insulating film; and 1918, an insulating film. In addition, a reference numeral 1919 denotes a wire such as a power supply line.

In a manufacturing process for the amorphous silicon TFT 1916, a known technique may be employed. First, a gate electrode is formed over the substrate 1910 and then the gate insulating film 1917 is formed. Next, an amorphous silicon film (active layer), a phosphorus-containing amorphous silicon film ($n^+$ layer), and a metal film are sequentially stacked. Subsequently, the amorphous silicon is etched into a desired element shape, and then selective etching is performed so that a part of the amorphous silicon is exposed in a region overlapped with the gate electrode to form a channel. Next, the entire surface is covered with the insulating film 1918, and then a contact hole, a source wire, and a drain wire are formed.

Note that the amorphous silicon TFT 1916 is shown as a channel-etch type TFT, but it may be a channel-stop type TFT.

In subsequent steps after manufacturing the amorphous silicon TFT, the first electrode 1913 and the partition 1911 having a cross-sectional shape which spreads toward the bottom are formed in a similar manner to Embodiment Mode 1.

Next, the layer 1914 containing an organic compound is formed by an evaporation method, an ink-jet method, or a coating method. Then, the second electrode 1915 is formed by an evaporation method or a sputtering method.

The manufacturing process for the amorphous silicon TFT includes few steps at high temperature and the process is suitable for mass production. Manufacturing cost of the light emitting device can be reduced.

In addition, since this embodiment mode explains an example of using an amorphous silicon TFT, only a pixel portion is formed over a substrate and a driver circuit is formed on an IC without forming a pixel portion and a driver circuit over the same substrate.

This embodiment mode can be freely combined with any one of Embodiment Modes 1 to 8.

This application is based on Japanese Patent Application serial no. 2005-302315 filed in Japan Patent Office on Oct. 17, 2005, the contents of which are hereby incorporated by reference.

What is claimed is:

1. A light emitting device comprising:
a flexible substrate;
a transistor over the flexible substrate;
a first electrode electrically connected to the transistor;

an insulating film covering an end portion of the first electrode;
a layer comprising a light emitting material over the first electrode; and
a second electrode over the layer comprising the light emitting material, wherein the insulating film has a cross-sectional shape,
wherein the cross-sectional shape comprises a first curved line, a second curved line, and a third curved line interposed between the first curved line and the second-curved line,
wherein the third curved line has a first center of curvature located outside the cross-sectional shape, and
wherein a thickness of the insulating film at the first curved line is larger than a thickness of the insulating film at the end portion of the first electrode.

2. The light emitting device according to claim 1, wherein the insulating film is a single layer.

3. The light emitting device according to claim 1, wherein a thickness of a portion including the first curved line is larger than a thickness of a portion including the second curved line.

4. The light emitting device according to claim 1,
wherein the first curved line has a second center of curvature located inside the insulating film, and
wherein the second curved line has a third center of curvature located inside the insulating film.

5. The light emitting device according to claim 1,
wherein the first curved line has a second center of curvature located under the first curved line, and
wherein the second curved line has a third center of curvature located under the second curved line.

6. The light emitting device according to claim 1, wherein the layer comprising the light emitting material is not provided over a portion including the first curved line.

7. The light emitting device according to claim 1, wherein the highest portion of the insulating film is higher than the highest portion of the layer comprising the light emitting material.

8. The light emitting device according to claim 1, wherein the insulating film is a partition.

9. The light emitting device according to claim 1, wherein the insulating film is a photosensitive resin film.

10. The light emitting device according to claim 1, further comprising a contact hall filled with the insulating film.

11. The light emitting device according to claim 1, further comprising two transistors in one pixel.

12. The light emitting device according to claim 1, wherein a portion including the first curved line does not overlap with a channel formation region of the transistor.

13. A light emitting device comprising:
a flexible substrate;
a transistor over the flexible substrate;
a first electrode electrically connected to the transistor;
an insulating film covering an end portion of the first electrode;
a layer comprising a light emitting material over the first electrode; and
a second electrode over the layer comprising the light emitting material, wherein the insulating film comprises a first portion, a second portion, and a third portion interposed between the first portion and the second portion,
wherein a top surface of the third portion is curved,
wherein the first portion comprises a first curved surface,
wherein the second portion comprises a second curved surface,
wherein the insulating film comprises a third curved surface having a first center of curvature located outside the insulating film,
wherein the third curved surface is provided between the first portion and the third portion, and
wherein a thickness of the insulating film at the third portion is larger than a thickness of the insulating film at the end portion of the first electrode.

14. The light emitting device according to claim 13, wherein the insulating film is a single layer.

15. The light emitting device according to claim 13,
wherein the thickness of the third portion is larger than a thickness of the second portion, and
wherein the layer comprising the light emitting material covers an end portion of the insulating film at the second portion.

16. The light emitting device according to claim 13,
wherein the first curved surface has a second center of curvature located inside the insulating film, and
wherein the second curved surface has a third center of curvature located inside the insulating film.

17. The light emitting device according to claim 13, wherein the layer comprising the light emitting material is not provided over the top surface of the third portion.

18. The light emitting device according to claim 13, wherein the highest portion of the insulating film is higher than the highest portion of the layer comprising the light emitting material.

19. The light emitting device according to claim 13, wherein the insulating film is a partition.

20. The light emitting device according to claim 13, wherein the insulating film is a photosensitive resin film.

21. The light emitting device according to claim 13, further comprising a contact hall filled with the insulating film.

22. The light emitting device according to claim 13, further comprising two transistors in one pixel.

23. The light emitting device according to claim 13, wherein the third portion does not overlap with a channel formation region of the transistor.

24. A light emitting device comprising:
a flexible substrate;
a transistor over the flexible substrate;
a first electrode electrically connected to the transistor;
an insulating film covering an end portion of the first electrode;
a layer comprising the light emitting material over the first electrode; and
a second electrode over the layer comprising the light emitting material, wherein the insulating film comprises a first region, a second region, and a third region interposed between the first region and the second region,
wherein the third region comprises a protruding portion including a first curved surface,
wherein the first region comprises a second curved surface,
wherein the second region comprises a third curved surface,
wherein the insulating film comprises a fourth curved surface having a first center of curvature located outside the insulating film,
wherein the third curved surface is provided between the third region and the first region, and
wherein a thickness of the protruding portion is larger than a thickness of the insulating film at the end portion of the first electrode.

25. The light emitting device according to claim 24, wherein the insulating film is a single layer.

26. The light emitting device according to claim 24,
wherein a thickness of the third region is larger than a thickness of the second region, and
wherein the layer comprising the light emitting material covers an end portion of the insulating film at the second region.

27. The light emitting device according to claim 24,
wherein the first curved surface has a second center of curvature located inside the insulating film,
wherein the second curved surface has a third center of curvature located inside the insulating film, and
wherein the third curved surface has a fourth center of curvature located inside the insulating film.

28. The light emitting device according to claim 24, wherein the layer comprising the light emitting material is not provided over the protruding portion.

29. The light emitting device according to claim 24, wherein the highest portion of the insulating film is higher than the highest portion of the layer comprising the light emitting material.

30. The light emitting device according to claim 24, wherein the insulating film is a partition.

31. The light emitting device according to claim 24, wherein the insulating film is a photosensitive resin film.

32. The light emitting device according to claim 24, further comprising a contact hall filled with the insulating film.

33. The light emitting device according to claim 24, further comprising two transistors in one pixel.

34. The light emitting device according to claim 24, wherein the protruding portion does not overlap with a channel formation region of the transistor.

* * * * *